(12) United States Patent
Hirota et al.

(10) Patent No.: US 7,161,360 B2
(45) Date of Patent: Jan. 9, 2007

(54) ELECTROSTATIC CAPACITANCE SENSOR, ELECTROSTATIC CAPACITANCE SENSOR COMPONENT, OBJECT MOUNTING BODY AND OBJECT MOUNTING APPARATUS

(75) Inventors: Yoshihiro Hirota, Kyoto (JP); Toshiyuki Matsumoto, Sanda (JP); Tatsuo Hiroshima, Narita (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 11/002,070

(22) Filed: Dec. 3, 2004

(65) Prior Publication Data

US 2005/0140378 A1    Jun. 30, 2005

Related U.S. Application Data

(62) Division of application No. 09/619,481, filed on Jul. 19, 2000, now Pat. No. 6,828,806.

(30) Foreign Application Priority Data

Jul. 22, 1999 (JP) ............................ 11-208294
Jul. 22, 1999 (JP) ............................ 11-208295

(51) Int. Cl.
    *G01R 27/26* (2006.01)
(52) U.S. Cl. ..................... 324/688; 324/690
(58) Field of Classification Search ............... 324/688, 324/690, 687, 686, 663, 662
See application file for complete search history.

(56) References Cited

U.S. PATENT DOCUMENTS

| 3,714,561 A | * | 1/1973 | Jaquay ..................... 324/662 |
| 3,798,541 A | * | 3/1974 | Campbell et al. .......... 324/72.5 |
| 4,473,796 A |   | 9/1984 | Nankivil |
| 4,498,044 A |   | 2/1985 | Horn |
| 4,789,822 A | * | 12/1988 | Ohmatoi ................... 324/685 |
| 4,918,376 A | * | 4/1990 | Poduje et al. ............. 324/663 |
| 5,070,302 A | * | 12/1991 | Marcus et al. ............. 324/662 |
| 5,416,470 A |   | 5/1995 | Tanaka et al. |
| 5,515,723 A |   | 5/1996 | Tsuchida et al. |

(Continued)

FOREIGN PATENT DOCUMENTS

DE    3413849 A1    8/1985

(Continued)

OTHER PUBLICATIONS

Dai Ming Yuan, Wien-Robinson-Oszillator zur Messung kleiner Kapazitätsänderungen, Elektronik, vol. 37, No. 9, Apr. 29, 1988, pp. 86-89.

(Continued)

*Primary Examiner*—Anjan Deb
(74) *Attorney, Agent, or Firm*—Barnes & Thornburg LLP

(57) ABSTRACT

An electrostatic capacitance sensor, includes an electrostatic capacitance detector, an operational amplifier in which a feedback impedance circuit is connected between an output terminal and an inverse input terminal of the operational amplifier, a signal line connected between the inverse input terminal of the operational amplifier and the electrostatic capacitance detector, an alternating-current signal generator connected to a non-inverse input terminal of the operational amplifier, and a shield for shielding at least a portion of the signal line, the shield being connected to the non-inverse input terminal of the operational amplifier and the alternating-current signal generator. The electrostatic capacitance detector includes a detecting electrode and a shield electrode. The detecting electrode includes a detector-detecting electrode for detecting an object to be detected and an electrode introducer-detecting electrode for introducing an electrode to the detector-detecting electrode. The shield electrode is connected to the shield. At least a portion of the electrode introducer-detecting electrode is shielded by the shield electrode.

18 Claims, 14 Drawing Sheets

U.S. PATENT DOCUMENTS

| | | | |
|---|---|---|---|
| 5,701,101 A | 12/1997 | Weinhardt et al. | |
| 5,726,581 A * | 3/1998 | Vranish | 324/688 |
| 5,808,516 A | 9/1998 | Barber | |
| 5,886,529 A | 3/1999 | Wakamatsu | |
| 6,054,867 A | 4/2000 | Wakamatsu | |
| 6,142,632 A * | 11/2000 | Inatome | 352/166 |
| 6,249,130 B1 * | 6/2001 | Greer | 324/687 |
| 6,335,642 B1 | 1/2002 | Hiroshima et al. | |
| 6,509,744 B1 * | 1/2003 | Biermann et al. | 324/662 |

FOREIGN PATENT DOCUMENTS

| | | |
|---|---|---|
| DE | 4135991 C1 | 12/1992 |
| EP | 0193421 A1 | 9/1986 |
| GB | 2002143 A | 2/1979 |
| GB | 2020816 A | 11/1979 |
| GB | 1580335 | 12/1980 |
| JP | 06180336 | 6/1994 |
| JP | 9-280806 | 10/1997 |
| JP | 09280806 | 10/1997 |

OTHER PUBLICATIONS

"Op-amp circuit measures diode-junction capacitance," by D. Monticelli and T. Frederiksen, Engineer's notebook, Electronics, Jul. 10, 1975.

* cited by examiner

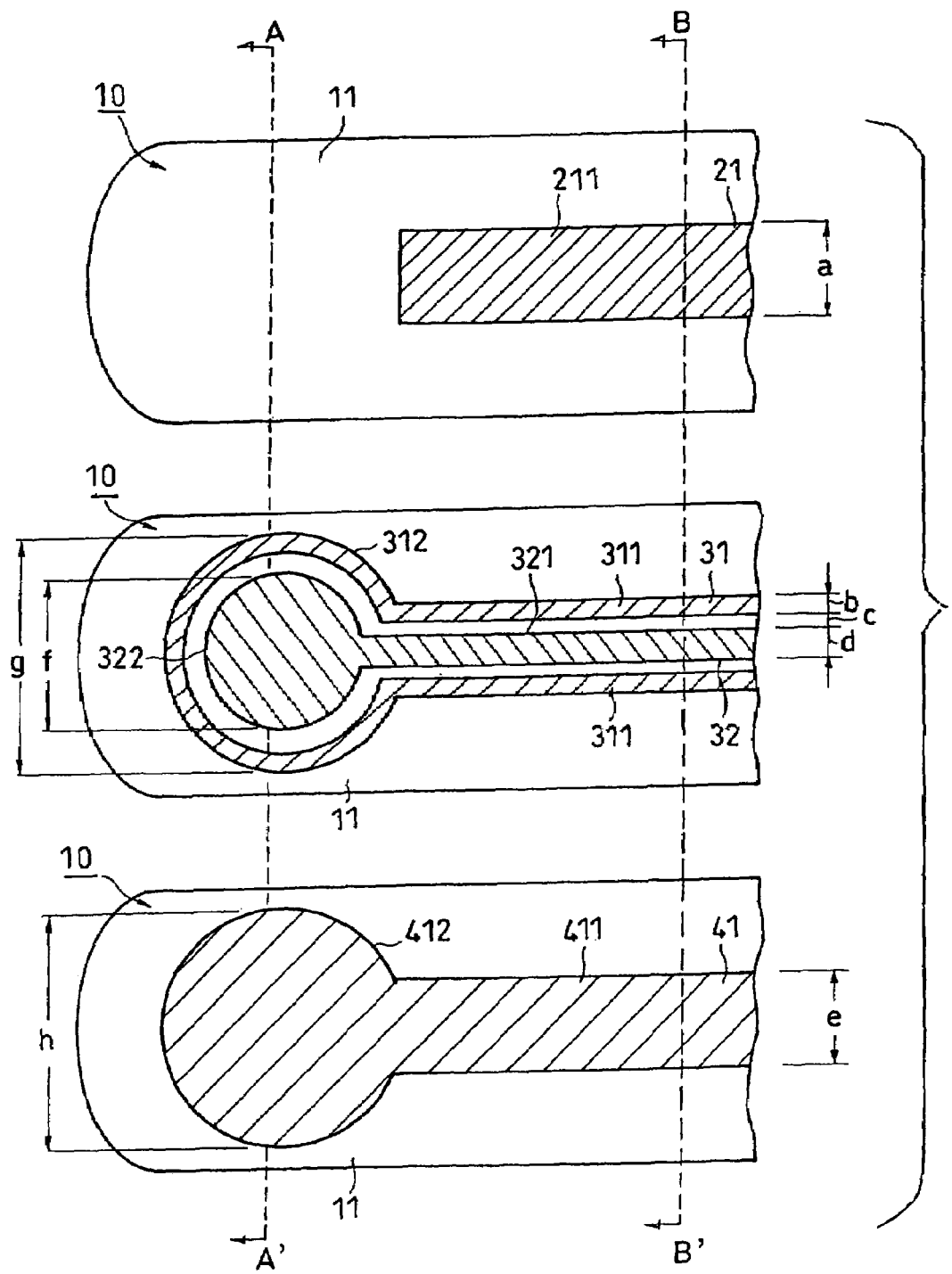

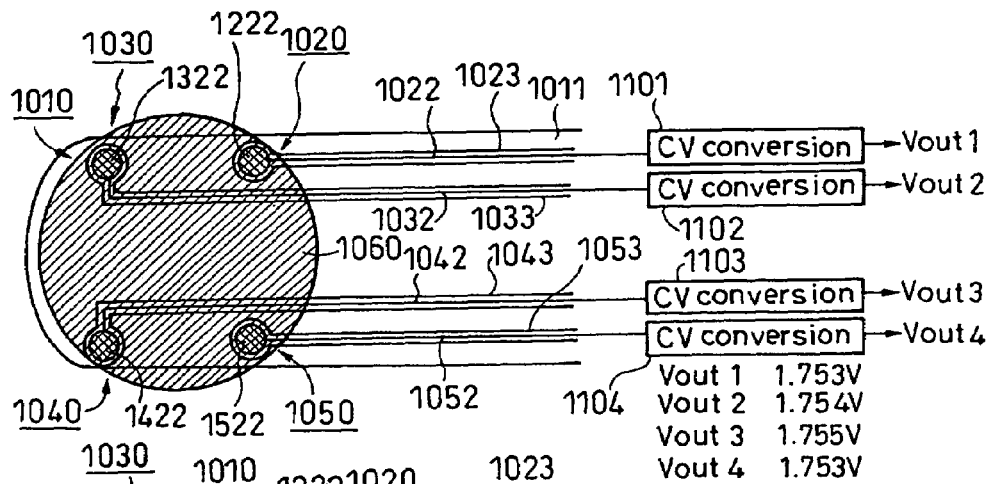
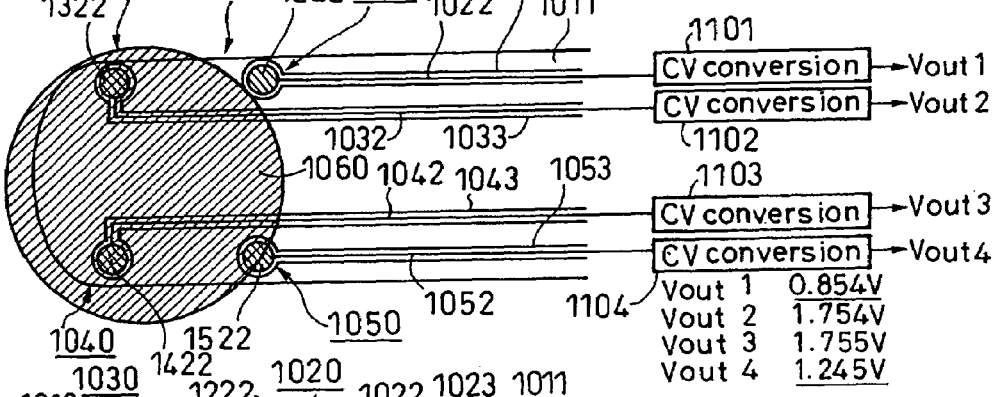
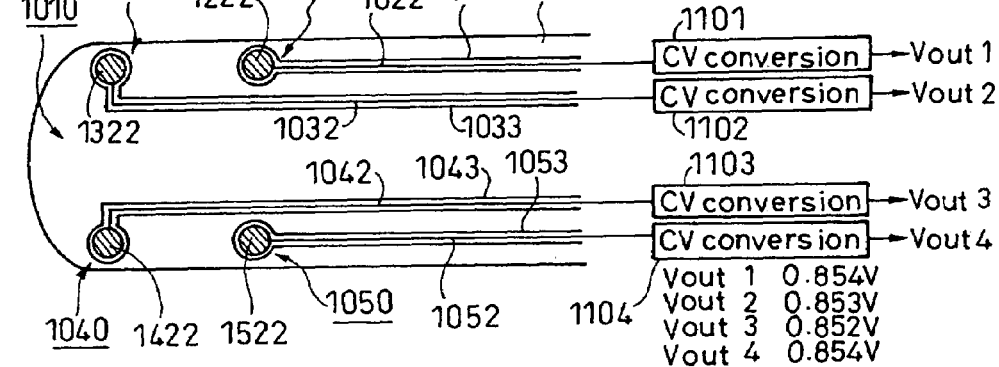

ELECTROSTATIC CAPACITANCE SENSOR, ELECTROSTATIC CAPACITANCE SENSOR COMPONENT, OBJECT MOUNTING BODY AND OBJECT MOUNTING APPARATUS

CROSS-REFERENCE

This is a Divisional of U.S. patent application Ser. No. 09/619,481 filed on Jul. 19, 2000 and now U.S. Pat. No. 6,828,806 dated Dec. 7, 2004.

BACKGROUND OF THE INVENTION

1. Field of the Invention

The present invention relates to an electrostatic capacitance sensor, an electrostatic capacitance sensor component, an object mounting body and an object mounting apparatus, and more particularly, to an electrostatic capacitance sensor which is a nearby-object detecting sensor utilizing a variation in electrostatic capacitance and which can be utilized for an FA (Factory Automation) device, an inspecting device, a robot, a semiconductor manufacturing apparatus and the like, an electrostatic capacitance sensor component for such an electrostatic capacitance sensor, an object mounting body including such an electrostatic capacitance sensor component, and an object mounting apparatus having such an electrostatic capacitance sensor.

2. Description of the Related Art

FIG. 15 shows a sensor and a front stage of an amplifier of a conventional electrostatic capacitance nearby-object detector described in Japanese Patent Application Laid-open No. H7-29467. In FIG. 15, a sensor 111 comprises a three-layer printed substrate 112. A first layer pattern formed on one face of the printed substrate 112 is a detecting electrode 112a disposed to be opposed to an object detecting region. An inside pattern of the printed substrate 112 is a second layer pattern for shielding the detecting electrode 112a, i.e., an in-phase shield pattern 112b. A third layer pattern formed on the other face of the printed substrate 112 is a shield earth pattern 112c. The shield earth pattern 112c is a pattern for reducing an influence of noise from outside acting on the detecting electrode 112a and the in-phase shield pattern 112b. The patterns 112a and 112b are respectively connected to a core wire and a coated wire of the shield cable 113, and connected to a side of a main circuit 114. In the main circuit 114, the core wire to which the detecting electrode 112a is connected is connected to an input terminal of a buffer circuit 115. An output terminal of the buffer circuit 115 is connected to the coated wire of the shield cable 113, and connected to an input terminal of a Schmitt trigger circuit 116. A feedback resistance R is connected between an output terminal of the Schmitt trigger circuit 116 and an input terminal of the buffer circuit 115.

If a grounded object approaches the detecting electrode 112a, an electrostatic capacitance Cd therebetween is increased. The buffer circuit 115 and the Schmitt trigger circuit 116 constitute an oscillation circuit 117 which oscillates with the electrostatic capacitance Cd and the feedback resistance R as the time constant components, and an output of the oscillation circuit 117 is connected to a periodic counter 118. The periodic counter 118 measures an oscillating period of the oscillation circuit 117, and an output of the periodic counter 118 is applied to a linearizer 119. The linearizer 119 linearizes a periodical variation to be a variation in a distance to the object. An output of the linearizer 119 is input to a display circuit 120 and a comparison circuit 121. The comparison circuit 121 discriminates input signals with respect to a predetermined threshold value, and a judging signal indicative of whether there exists an object is output from an output circuit 122.

According to the above structure, since the detecting electrode 112a and the in-phase shield pattern 112b are connected to the input and output terminals of the buffer circuit 115 through the shield cable 113, the detecting electrode 112a and the in-phase shield pattern 112b are always at the same phase and same voltage. Therefore, the detecting electrode 112a does not receive an influence of the electrostatic capacitance between the detecting electrode 112a and the in-phase shield pattern 112b. Thus, a sensor section having the detecting electrode and an electronic circuit section can be separated from each other by the shield cable 113.

As described above, according to Japanese Patent Application Laid-open No. H7-29467, the sensor comprises the first layer pattern 112a of the detecting electrode for detecting the object, the second layer pattern 112b for the shield, and the grounded third layer electrode pattern. The amplifier and the detecting electrode are connected through the shield cable 113, and the separate ground wire is provided. This structure has the following problems:

(1) This structure requires a detecting electrode wire, a shield wire and a grounding wire, and the structure is complicated and the cost is increased.

(2) This structure requires a detecting electrode, a shield electrode and a grounding electrode, and the structure is complicated and the cost is increased.

SUMMARY OF THE INVENTION

It is, therefore, a main object of the present invention to provide an electrostatic capacitance sensor of a simple structure, an electrostatic capacitance sensor component for such an electrostatic capacitance sensor, an object mounting body including such an electrostatic capacitance sensor component, and an object mounting apparatus having such an electrostatic capacitance sensor.

According to a first aspect of the present invention, there is provided an electrostatic capacitance sensor, comprising an electrostatic capacitance detector, an operational amplifier in which a feedback impedance circuit is connected between an output terminal and an inverse input terminal of the operational amplifier, a signal line connected between the inverse input terminal of the operational amplifier and the electrostatic capacitance detector, an alternating-current signal generator connected to a non-inverse input terminal of the operational amplifier, and a shield for shielding at least a portion of the signal line, the shield being connected to the non-inverse input terminal of the operational amplifier and the alternating-current signal generator, wherein the electrostatic capacitance detector comprises a detecting electrode and a shield electrode, the detecting electrode comprises a detector-detecting electrode for detecting an object to be detected and an electrode introducer-detecting electrode for introducing an electrode to the detector-detecting electrode, the shield electrode is connected to the shield, and at least a portion of the electrode introducer-detecting electrode is shielded by the shield electrode.

According to a second aspect of the present invention, there is provided an object mounting body for mounting an object to be mounted, comprising a detecting electrode and a shield electrode, wherein the detecting electrode comprises a detector-detecting electrode for detecting an object to be detected and an electrode introducer-detecting electrode for introducing an electrode to the detector-detecting electrode, the detecting electrode and the shield electrode are flat plate-like electrodes and laminated such that they become layers different from each other, and the detecting electrode and the shield electrode are provided such that the detecting electrode and the shield electrode are not superposed, and at least a portion of the electrode introducer-detecting electrode and the shield electrode are superposed as viewed from the laminated direction of the detecting electrode and the shield electrode.

According to a third aspect of the present invention, there is provided an electrostatic capacitance sensor component, comprising an electrostatic capacitance detector having a detecting electrode and a first shield electrode, and a flat plate-like second shield electrode laminated with the detecting electrode such that the second shield electrode and the detecting electrode become layers different from each other, wherein the detecting electrode comprises a detector-detecting electrode for detecting an object to be detected and an electrode introducer-detecting electrode for introducing an electrode to the detector-detecting electrode, the detector-detecting electrode is a flat plate-like electrode, the detecting electrode and the first shield electrode are provided such that at least a portion of the first shield electrode is located on a side of the detector-detecting electrode as viewed from a direction perpendicular to a main face of the flat plate-like electrode, and the detecting electrode and the second shield electrode are provided such that the detecting electrode and the second shield electrode are not superposed, and at least a portion of the electrode introducer-detecting electrode and the second shield electrode are superposed as viewed from the laminated direction.

According to a fourth aspect of the present invention, there is provided an electrostatic capacitance sensor component comprising an electrostatic capacitance detector having a detecting electrode and a first shield electrode, and a flat plate-like second shield electrode laminated with the detecting electrode such that the second shield electrode and the detecting electrode become layers different from each other, wherein the detecting electrode comprises a detector-detecting electrode for detecting an object to be detected and an electrode introducer-detecting electrode for introducing an electrode to the detector-detecting electrode, the detector-detecting electrode is a flat plate-like electrode, the detecting electrode and the first shield electrode are provided such that at least a portion of the first shield electrode is located on a side of the detector-detecting electrode as viewed from a direction perpendicular to a main face of the flat plate-like electrode, and the detecting electrode and the second shield electrode are provided such that the detector-detecting electrode and the electrode introducer-detecting electrode are superposed above the second shield electrode as viewed from the laminated direction of the detecting electrode and the shield electrode.

According to a fifth aspect of the present invention, there is provided an object mounting apparatus, comprising an object mounting body for mounting an object, at least two object detecting electrodes mounted to the object mounting body, and at least two detecting circuits respectively connected to the at least two object detecting electrodes, wherein each of the two detecting circuits comprises an operational amplifier in which a feedback impedance circuit is connected between an output terminal and an inverse input terminal of the operational amplifier, a signal line connected between the inverse input terminal of the operational amplifier and one of the at least two object detecting electrodes, an alternating-current signal generator connected to a non-inverse input terminal of the operational amplifier, and a shield for shielding at least a portion of the signal line, the shield being connected to the non-inverse input terminal of the operational amplifier and the alternating-current signal generator.

According to a sixth aspect of the present invention, there is provided an object mounting apparatus, comprising an object mounting body for mounting an object, at least two object detecting electrodes mounted to the object mounting body, an operational amplifier in which a feedback impedance circuit is connected between an output terminal and an inverse input terminal of the operational amplifier, a signal line connected to the inverse input terminal of the operational amplifier, an alternating-current signal generator connected to a non-inverse input terminal of the operational amplifier, a shield for shielding at least a portion of the signal line, the shield being connected to the non-inverse input terminal of the operational amplifier and the alternating-current signal generator, and a switch for switching connections between the signal line and the at least two object detecting electrodes and capable of connecting the signal line to any one of the at least two object detecting electrodes.

BRIEF DESCRIPTION OF THE DRAWINGS

The above and further objects, features and advantages of the present invention will become more apparent from the following detailed description taken in conjunction with the accompanying drawings, wherein:

FIG. 1 is a schematic partial transversal sectional view for explaining a transfer arm having a semiconductor wafer-detecting function according to a first embodiment of the present invention;

FIGS. 2A and 2B are schematic longitudinal sectional views for explaining the transfer arm having the semiconductor wafer-detecting function according to the first embodiment of the present invention, wherein FIG. 2A is a schematic longitudinal sectional view taken along the line AA' of FIG. 1, and FIG. 2B is a schematic longitudinal sectional view taken along the line BB' of FIG. 1;

FIGS. 4A and 4B are schematic longitudinal sectional views for explaining the transfer arm having the semiconductor wafer-detecting function according to the second embodiment of the present invention, wherein FIG. 4A is a schematic longitudinal sectional view taken along the line CC' of FIG. 3, and FIG. 4B is a schematic longitudinal sectional view taken along the line DD' of FIG. 3;

FIGS. 6A, 6B and 6C are schematic partial transversal sectional views for explaining detecting operation of a wafer by the transfer arm having the semiconductor wafer-detecting function according to the second embodiment of the invention;

DESCRIPTION OF THE PREFERRED EMBODIMENTS

1st Embodiment

Figure 2A:
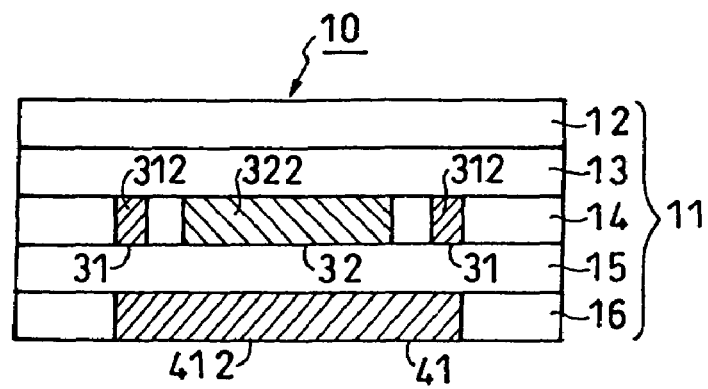
Figure 2B:
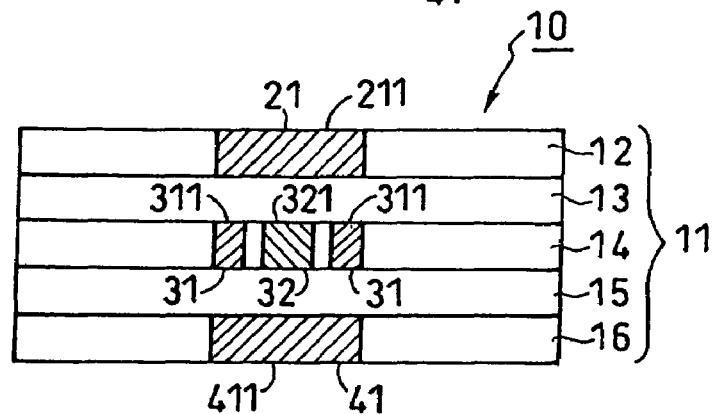
Figure 3:
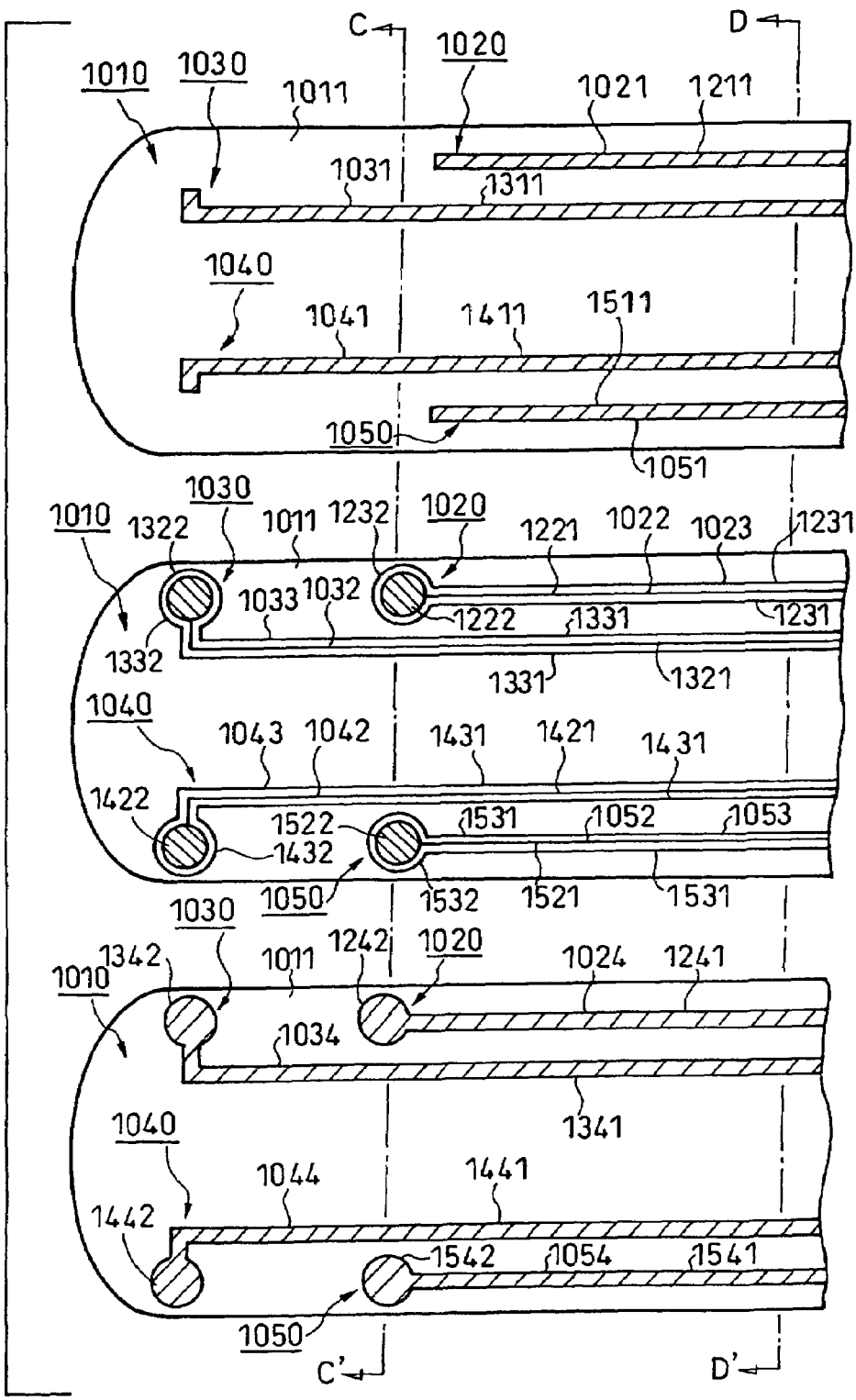
FIG. 3 is a schematic partial transversal sectional view for explaining a transfer arm having a semiconductor wafer-detecting function according to a second embodiment of the present invention.
Figure 4A:
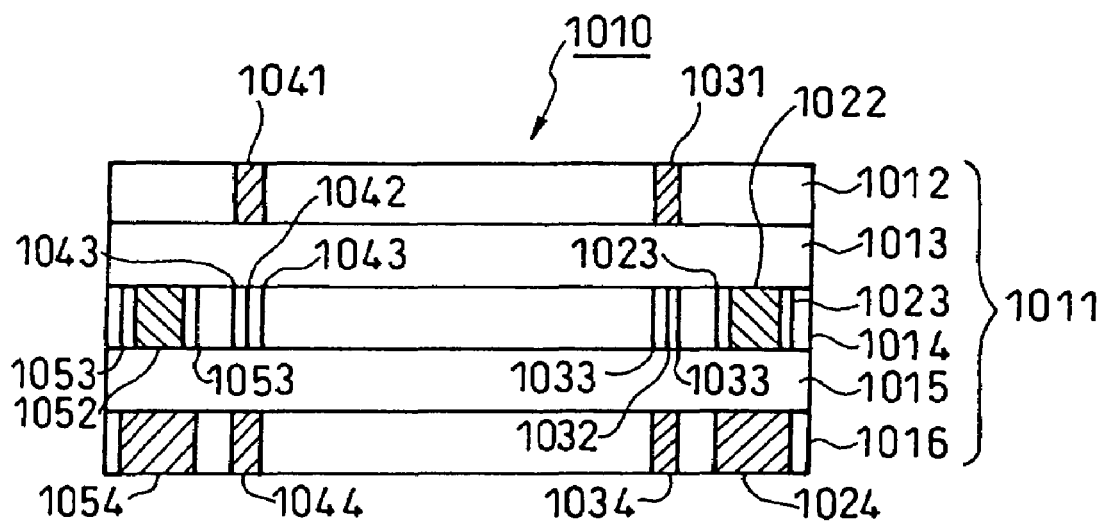
Figure 4B:
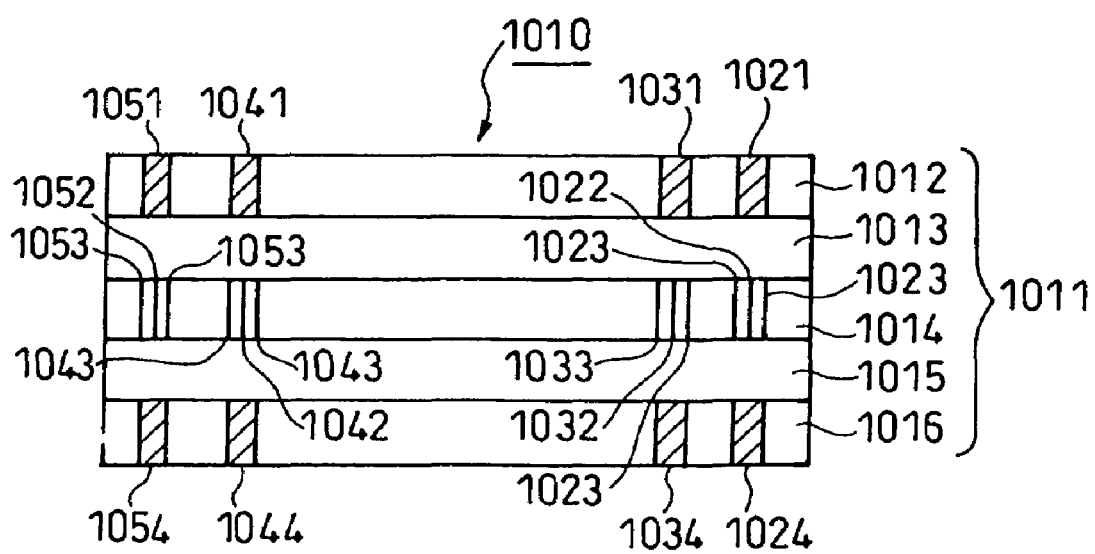

Referring to FIGS. 1, 2A and 2B, a transfer arm 10 having a wafer-detecting function comprises an insulator 11, a detecting electrode 32 and shield electrodes 21, 31 and 41. The insulator 11 is integrally formed with insulator layers 12 to 16. A thickness of each of the insulator layers 12 to 16 is 0.5 mm. The insulator layer 12 is formed with the shield electrode 21, the insulator layer 14 is formed with the detecting electrode 32 and the shield electrode 31, and the insulator layer 16 is formed with the shield electrode 41. The insulator layer 14 is laminated above the insulator layer 16 with the insulator layer 15 interposed therebetween, and the insulator layer 12 is laminated above the insulator layer 14 with the insulator layer 13 interposed therebetween.

The transfer arm 10 having the wafer-detecting function was formed in such a manner that sheets of alumina-based ceramics were formed by a sheet forming method, electrodes were formed on the sheets by a screen printing method, the sheets were positioned and laminated on one another, the sheets were cut into an arm-shape, and the sheets were sintered simultaneously.

Next, structures of the detecting electrode 32 and the shield electrodes 21, 31, 41 of the thus manufactured transfer arm 10 having the wafer-detecting function and a positional relationship between these electrodes will be explained.

The detecting electrode 32 and the shield electrode 31 are formed above the shield electrode 41 through the insulator layer 15, and the shield electrode 21 is formed above the detecting electrode 32 and the shield electrode 31 through the insulator layer 13.

The detecting electrode 32 comprises a circular detector-detecting electrode 322 for detecting an object to be detected (which will be referred to as "to-be detected object" hereinafter), and an electrode introducer-detecting electrode 321 for introducing an electrode to the detector-detecting electrode 322. The shield electrode 31 and the detecting electrode 32 are provided in the same layer. The shield electrode 31 surrounds the detecting electrode 32 in a direction parallel to the main face of the detecting electrode 32. The shield electrode 31 comprises a detector-shield electrode 312 and an electrode introducer-shield electrode 311. The detector-shield electrode 312 surrounds the detector-detecting electrode 322 in a direction parallel to a main face of the detecting electrode 32. The insulator 11 exists between the detector-shield electrode 312 and the detector-detecting electrode 322. The two electrode introducer-shield electrodes 311 are provided at both sides of the electrode introducer-detecting electrode 321 in parallel thereto in a direction parallel to the main face of the detecting electrode 32. The insulator 11 exists between the electrode introducer-shield electrodes 311 and the electrode introducer-detecting electrode 321.

The shield electrode 21 comprises an electrode introducer-shield electrode 211. The electrode introducer-shield electrode 211 is provided to be faced with the electrode introducer-detecting electrode 321 and the electrode introducer-shield electrodes 311 provided at the both sides of the electrode introducer-detecting electrode 321. The insulator 11 exists between the electrode introducer-shield electrode 211, and the following electrodes of the electrode introducer-detecting electrode 321 and the electrode introducer-shield electrodes 311 provided at the both sides thereof. The shield electrode 21 is not opposed to the detector-detecting electrode 322, and the detector-detecting electrode 322 is exposed from the shield electrode 21. Therefore, a to-be detected object can be detected by measuring a capacitance value formed between the to-be detected object and the detector-detecting electrode 322.

The shield electrode 41 comprises a detector-shield electrode 412 and an electrode introducer-shield electrode 411. The detector-shield electrode 412 is provided to be faced with the detector-detecting electrode 321 and the detector-shield electrode 312 located around the detector-detecting electrode 321. The electrode introducer-shield electrode 411 is provided to be faced with the electrode introducer-detecting electrode 321 and the electrode introducer-shield electrodes 311 located at both sides of the electrode introducer-detecting electrode 321. The insulator 11 exists between the shield electrode 41, and the following electrodes of the detecting electrode 32 and the shield electrode 31.

In the present embodiment, using a Z/v conversion (impedance-voltage conversion) device including an operational amplifier which will be explained afterward, the detecting electrode 32 is connected to an inverse input terminal of the operational amplifier, and the shield electrodes 21, 31 and 41 are connected to the non-inverse input terminal of the operational amplifier. Since the two input terminals (the inverse input terminal and the non-inverse input terminal) of the operational amplifier are in an imaginary short state, the detecting electrode 32 and the shield electrodes 21, 31 and 41 are at the same electric potential. Therefore, it is possible to obtain a voltage which relies only on a value of an impedance component (capacitance value in the present embodiment) formed by the detector-detecting electrode 322 and the to-be detected object without being influenced by a parasitic capacitance formed between the detecting electrode 32 and the shield electrodes 21, 31 and 41, and it is possible to convert Z/v with high precision (even if the impedance value is very large, i.e. capacitance value is very small).

As a result, as compared with the technique described in the above-described Japanese Patent Application Laid-open No. H7-29467, no ground line is required, which reduces the costs, and no ground electrode is required, which also reduces the costs.

Further, as described above, since the detector-detecting electrode 322 is surrounded by the detector-shield electrode 312 in the direction parallel to the main face of the detecting electrode 32, an object existing in a lateral direction of the transfer arm 10 having the wafer-detecting function is not detected, and the detecting performance of the arm 10 is enhanced.

As described above, since the detector-shield electrode 412 is provided directly below the detector-detecting electrode 322, the detecting function of the detector-detecting electrode 322 is not influenced by a to-be detected object existing below the transfer arm 10 having the wafer-detecting function, and the detecting performance of the arm 10 is enhanced. Even if a plurality of transfer arms 10 having the wafer-detecting function are disposed in a vertical direction, a certain transfer arm 10 detects only a subject which is disposed directly above the detector-detecting electrode 322, and the performance of the arm 10 is enhanced.

As described above, in the present embodiment, the detecting electrode 32 and the shield electrodes 21, 31 and 41 are at the same potential, and it is possible to obtain a voltage which relies only on a value of an impedance component (capacitance value in the present embodiment) formed by the detector-detecting electrode 322 and the to-be detected object without being influenced by a parasitic capacitance formed between the detecting electrode 32 and the shield electrodes, 21, 31 and 41, and it is possible to convert Z/V with high precision (even if the impedance value is very large, i.e. capacitance value is very small). Since the sensor circuit can detect the electrostatic capacitance with high precision, the sensor may not be very sensitive, and the electrode structure can be simplified. Thus, the transfer arm 10 having the wafer-detecting function may be provided with the detecting electrode 32 only, and even if only one of the shield electrodes 21, 31 and 41 is provided, the performance of the arm is enhanced. Therefore, the arm can be formed by providing a detecting electrode and a shield electrode on one face of only one ceramics substrate to form the arm, and the arm can also be formed by baking electrodes on both faces of one ceramics substrate.

The transfer arm 10 having the wafer-detecting function of the above-described present embodiment was formed. Referring to FIG. 1, a width "a" of the electrode introducer-shield electrode 211 was set to 30 mm, a width "b" of the shield electrode 31 was set to 6 mm, a width "d" of the electrode introducer-detecting electrode 321 was set to 12 mm, a distance "c" between the electrode introducer-shield electrode 311 and the electrode introducer-detecting electrode 321 was set to 4 mm, a diameter "f" of the detector-detecting electrode 322 was set to 50 mm, an outer diameter "g" of the detector-shield electrode 312 was set to 70 mm, a width "e" of the electrode introducer-shield electrode 411 was set to 30 mm, and a diameter "h" of the detector-shield electrode 412 was set to 70 mm.

Figure 9:
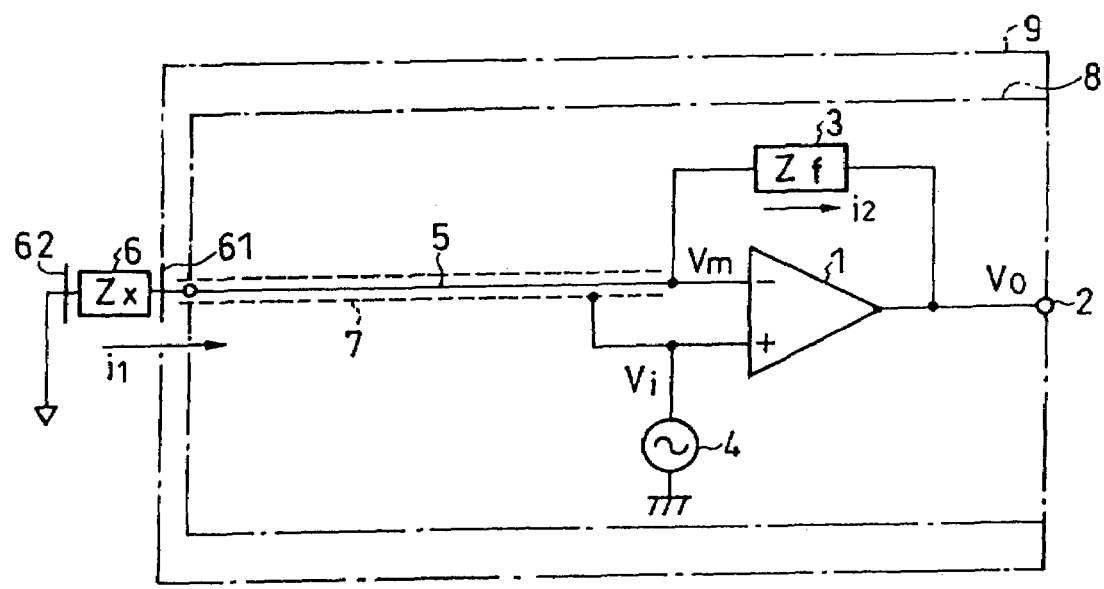
FIG. 9 is a circuit diagram for showing a first example of an impedance-voltage (Z/V) conversion device according to the first to third embodiments of the present invention.
Figure 10:
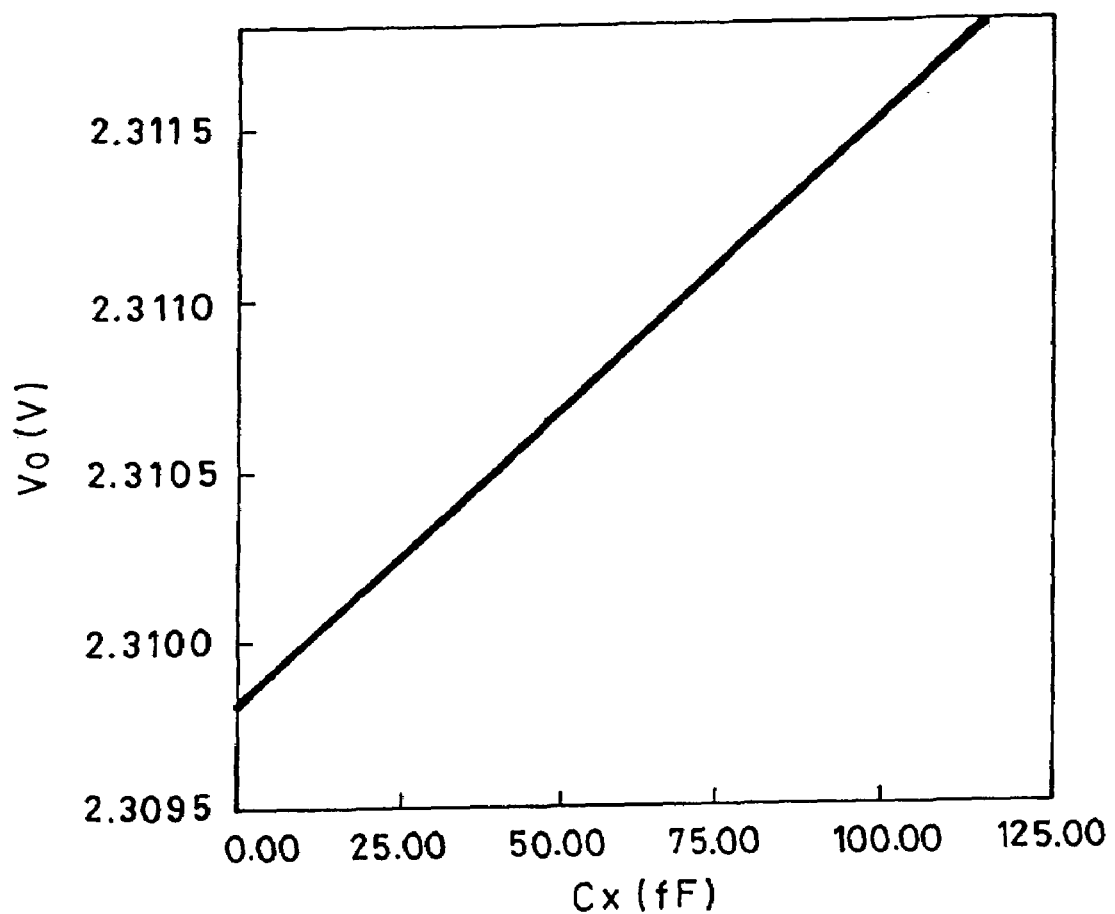
FIG. 10 is a graph showing one example of a relation between Cx and an output voltage Vo obtained by an experiment in which impedance to be detected is formed to be a capacitance component in a Z/V conversion device according to the first to third embodiments of the present invention.

The detecting electrode 32 of the transfer arm 10 having the wafer-detecting function formed in this manner was connected to a signal line 5 of the ZN conversion apparatus shown in FIG. 9, the shield electrodes 21, 31 and 41 of the transfer arm 10 having the wafer-detecting function were connected to the shield 7, and a subject (in this case, a silicon wafer) was detected. As a result, a sufficiently recognizable variation in the output voltage of the circuit was able to be confirmed (a variation in the output voltage of several mV (millivolt) was confirmed when the wafer came close, and a variation in the output voltage of hundreds mV was confirmed when the wafer came into contact) when the wafer came into contact with an upper face of the arm 10 (e.g., a side of the arm 10 on which the circular detector-detecting electrode 322 was not shielded) or when the wafer approached the upper face of the arm 10 to be within several cm. On the other hand, when the wafer approached or came into contact a back face of the arm 10 (a side of the arm 10 on which the detector-detecting electrode 322 was shielded), no variation was confirmed. The above detecting results for the upper and back faces of the arm 10 confirmed an effective detecting effect.

2nd Embodiment

Referring to FIGS. 3, 4A, 4B, 5, 6A, 6B and 6C, a transfer arm 1010 having a wafer-detecting function of the second embodiment comprises an insulator 1011, and four sensor electrodes 1020, 1030, 1040 and 1050. Insulator layers 1012 to 1016 are integrally formed to constitute the insulator 1011. A thickness of each of the insulator layers 1012 to 1016 is 0.5 mm. The sensor electrode 1020 comprises a detecting electrode 1022, and shield electrodes 1021, 1023 and 1024. The sensor electrode 1030 comprises a detecting electrode 1032 and shield electrodes 1031, 1033 and 1034. The sensor electrode 1040 comprises a detecting electrode 1042 and shield electrodes 1041, 1043 and 1044. The sensor electrode 1050 comprises a detecting electrode 1052 and shield electrodes 1051, 1053 and 1054. The insulator layer 1012 is formed with shield electrodes 1021, 1031, 1041 and 1051. The insulator layer 1014 is formed with detecting electrodes 1022, 1032, 1042 and 1052 and shield electrodes 1023, 1033, 1043 and 1053. The insulator layer 1016 is formed with shield electrodes 1024, 1034, 1044 and 1054. The insulator layer 1014 is laminated above the insulator layer 1016 with the insulator layer 1015 interposed therebetween. The insulator layer 1012 is laminated above the insulator layer 1014 with the insulator layer 1013 interposed therebetween.

The transfer arm 1010 having the wafer-detecting function was formed in such a manner that sheets of alumina-based ceramics were formed by a sheet forming method, electrodes were formed on the sheets by a screen printing method, the sheets were positioned and laminated on one another, the sheets were cut into an arm-shape, and the sheets were sintered simultaneously.

Next, the structure of the four sensor electrodes 1020, 1030, 1040 and 1050 of the thus formed transfer arm 10 having the wafer-detecting function and the positional relationship between these electrodes will be explained.

Since the four sensor electrodes 1020, 1030, 1040 and 1050 have substantially the same structures, an explanation will be made while taking the case of the sensor electrode 1020.

The detecting electrode 1022 and the shield electrode 1023 are formed above the shield electrode 1024 through the insulator layer 1015, and the shield electrode 1021 is formed above the detecting electrode 1022 and the shield electrode 1023 through the insulator layer 1013.

The detecting electrode 1022 comprises a circular detector-detecting electrode 1222 for detecting a to-be detected object, and an electrode introducer-detecting electrode 1221 for introducing an electrode to the detector-detecting electrode 1222. The shield electrode 1023 and the detecting electrode 1022 are provided in the same layer. The shield electrode 1023 surrounds the detecting electrode 1022 in a direction parallel to the main face of the detecting electrode 1022. The shield electrode 1023 comprises a detector-shield electrode 1232 and an electrode introducer-detecting electrode 1231. The detector-shield electrode 1232 surrounds the detector-detecting electrode 1222 in a direction parallel to a main face of the detecting electrode 1022. The insulator 1011 exists between the detector-shield electrode 1232 and the detector-detecting electrode 1222. The two electrode introducer-shield electrodes 1231 are provided at both sides of the electrode introducer-detecting electrode 1221 in parallel thereto in a direction parallel to the main face of the detecting electrode 1022. The insulator 1011 exists between the electrode introducer-shield electrodes 1231 and the electrode introducer-detecting electrode 1221.

The shield electrode 1021 comprises an electrode introducer-shield electrode 1211. The electrode introducer-shield electrode 1211 is provided to be faced with the electrode introducer-detecting electrode 1221 and the electrode introducer-shield electrodes 1211 provided at the both sides of the electrode introducer-detecting electrode 1221. The insulator 1011 exists between the electrode introducer-shield electrode 1211, and the following electrodes of the electrode introducer-detecting electrode 1221 and the electrode introducer-shield electrodes 1231 provided at the both sides thereof. The shield electrode 1021 is not opposed to the detector-detecting electrode 1222, and the detector-detecting electrode 1222 is exposed from the shield electrode 1021. Therefore, a to-be detected object can be detected by measuring a capacitance value formed between the to-be detected object and the detector-detecting electrode 1222.

The shield electrode 1024 comprises a detector-shield electrode 1242 and an electrode introducer-shield electrode 1241. The detector-shield electrode 1242 is provided to be faced with the detector-detecting electrode 1222 and the detector-shield electrode 1232 located around the detector-detecting electrode 1222. The electrode introducer-shield electrode 1241 is provided to be faced with the electrode introducer-detecting electrode 1221 and the electrode introducer-detecting electrodes 1231 located at the both sides of the electrode introducer-detecting electrode 1221. The insulator 1011 exists between the shield electrode 1024, and the following electrodes of the detecting electrode 1022 and the shield electrode 1023.

The sensor electrode 1030 comprises a detecting electrodes 1032 and shield electrodes 1031, 1033 and 1034. The detecting electrode 1032 comprises a circular detector-detecting electrode 1322 for detecting the to-be detected object, and an electrode introducer-detecting electrode 1321 for introducing an electrode to the detector-detecting electrode. The shield electrode 1031 comprises an electrode introducer-shield electrode 1311, the shield electrode 1033 comprises a detector-shield electrode 1332 and an electrode introducer-shield electrode 1331. The shield electrode 1034 comprises a detector-shield electrode 1342 and an electrode introducer-shield electrode 1341.

The sensor electrode 1040 comprises a detecting electrodes 1042 and shield electrodes 1041, 1043 and 1044. The detecting electrode 1042 comprises a circular detector-detecting electrode 1422 for detecting the to-be detected object, and an electrode introducer-detecting electrode 1421 for introducing an electrode to the detector-detecting electrode. The shield electrode 1041 comprises an electrode introducer-shield electrode 1411, the shield electrode 1043 comprises a detector-shield electrode 1432 and an electrode introducer-shield electrode 1431. The shield electrode 1044 comprises a detector-shield electrode 1442 and an electrode introducer-shield electrode 1441.

The sensor electrode 1050 comprises a detecting electrodes 1052 and shield electrodes 1051, 1053 and 1054. The detecting electrode 1052 comprises a circular detector-detecting electrode 1522 for detecting the to-be detected object, and an electrode introducer-detecting electrode 1521 for introducing an electrode to the detector-detecting electrode. The shield electrode 1051 comprises an electrode introducer-shield electrode 1511, the shield electrode 1053 comprises a detector-shield electrode 1532 and an electrode introducer-shield electrode 1531. The shield electrode 1054 comprises a detector-shield electrode 1542 and an electrode introducer-shield electrode 1541.

Since these sensor electrodes 1030, 1040 and 1050 have substantially the same structures as that of the sensor electrode 1020, explanation thereof will be omitted.

In the present embodiment, four Z/V conversion (impedance-voltage conversion) devices each including an operational amplifier which will be explained later are used as the C/V conversion (electrostatic capacitance-voltage conversion) device. The sensor electrode 1020 is connected to a C/V conversion device 1101, the sensor electrode 1030 is connected a C/V conversion device 1102, the sensor electrode 1040 is connected a C/V conversion device 1103, and the sensor electrode 1050 is connected a C/V conversion device 1104. That is, the detecting electrode 1022 is connected to an inverse input terminal of an operational amplifier of the C/V conversion device 1101, and the shield electrodes 1021, 1023 and 1024 are connected to a non-inverse input terminal of the operational amplifier of the C/V conversion device 1101. Further, the detecting electrode 1032 is connected to an inverse input terminal of an operational amplifier of the C/V conversion device 1102, and the shield electrodes 1031, 1033 and 1034 are connected to a non-inverse input terminal of the operational amplifier of the C/V conversion device 1102. Further, the detecting electrode 1042 is connected to an inverse input terminal of an operational amplifier of the C/V conversion device 1103, and the shield electrodes 1041, 1043 and 1044 are connected to a non-inverse input terminal of the operational amplifier of the C/V conversion device 1103. Further, the detecting electrode 1052 is connected to an inverse input terminal of an operational amplifier of the C/V conversion device 1104, and the shield electrodes 1051, 1053 and 1054 are connected to a non-inverse input terminal of the operational amplifier of the C/V conversion device 1104.

Since the two input terminals (the inverse input terminal and the non-inverse input terminal) of each of the operational amplifiers of the C/V conversion devices 1101 to 1104 are in an imaginary short state, the detecting electrode 1022 and the shield electrodes 1021, 1023 and 1024 are at the same electric potential, the detecting electrode 1032 and the shield electrodes 1031, 1033 and 1034 are at the same electric potential, the detecting electrode 1042 and the shield electrodes 1041, 1043 and 1044 are at the same electric potential, and the detecting electrode 1052 and the shield electrodes 1051, 1053 and 1054 are at the same electric potential. Therefore, it is possible to obtain a voltage which relies only on a value of an impedance component (capacitance value in the present embodiment) formed by the detector-detecting electrode 1222, 1322, 1422 and 1522 and the to-be detected object without being influenced by a parasitic capacitance formed between the detecting electrode 1022, 1032, 1042 and 1052 and the shield electrodes 1021, 1023, 1024, 1031, 1033, 1034, 1041, 1043, 1044, 1051, 1053 and 1054, and it is possible to convert Z/V with high precision (even if the impedance value is very large, i.e. capacitance value is very small).

As a result, as compared with the technique described in the above-described Japanese Patent Application Laid-open No. H7-29467, no ground line is required, which reduces the costs, and no ground electrode is required, which also reduces the costs.

Further, as described above, since the detector-detecting electrode 1222 is surrounded by the detector-shield electrode 1232 in the direction parallel to the main face of the detecting electrode 1022, the detector-detecting electrode 1322 is surrounded by the detector-shield electrode 1332 in the direction parallel to the main face of the detecting electrode 1032, the detector-detecting electrode 1422 is surrounded by the detector-shield electrode 1432 in the direction parallel to the main face of the detecting electrode 1042, and the detector-detecting electrode 1522 is surrounded by the detector-shield electrode 1532 in the direction parallel to the main face of the detecting electrode 1052, an object existing in a lateral direction of the transfer arm 1010 having the wafer-detecting function is not detected, and the detecting performance of the arm 1010 is enhanced.

As described above, since the detector-shield electrode 1242 is provided directly below the detector-detecting electrode 1222, the detector-shield electrode 1342 is provided directly below the detector-detecting electrode 1322, the detector-shield electrode 1442 is provided directly below the detector-detecting electrode 1422, and the detector-shield electrode 1542 is provided directly below the detector-detecting electrode 1522, the detecting function of the detector-detecting electrodes 1222, 1322, 1422 and 1522 is not influenced by a to-be detected object existing below the transfer arm 1010 having the wafer-detecting function, and the detecting performance of the arm 1010 is enhanced. Even if a plurality of transfer arms 1010 having the wafer-detecting function are disposed in a vertical direction, a certain transfer arm 1010 detects only a subject which is disposed directly above the detector-detecting electrode 1222, 1322, 1422 and 1522 and the performance of the arm 1010 is enhanced.

As described above, in the present embodiment, the detecting electrode 1022 and the shield electrodes 1021, 1023 and 1024 are at the same potential, the detecting electrode 1032 and the shield electrodes 1031, 1033 and 1034 are at the same potential, the detecting electrode 1042 and the shield electrodes 1041, 1043 and 1044 are at the same potential, and the detecting electrode 1052 and the shield electrodes 1051, 1053 and 1054 are at the same potential, and therefore it is possible to obtain a voltage which relies only on a value of an impedance component (capacitance value in the present embodiment) formed by each of the detector-detecting electrodes 1222, 1322, 1422 and 1522 and each to-be detected object without being influenced by a parasitic capacitance formed between these detecting electrodes and these shield electrodes, and it is possible to convert Z/V with high precision (even if the impedance value is very large, i.e. capacitance value is very small).

Since the C/V conversion circuits used in the present embodiment can detect the electrostatic capacitance with high precision, the sensor may not be very sensitive, and an area of the sensor electrode can be reduced to a small value. If the sensor electrode is made relatively smaller, a variation ratio of the electrostatic capacitance when a deviation of the to-be detected object is detected can be made greater, and a detection sensibility of deviation is enhanced.

In the present embodiment, a semiconductor silicon wafer 1060 was used as a to-be detected object. Four detector-detecting electrodes 1222, 1322, 1422, 1522 were provided on the transfer arm 1010 having the wafer-detecting function such that when the semiconductor silicon wafer 1060 was mounted on the transfer arm 1010 having the wafer-detecting function and the semiconductor silicon wafer 1060 was equally divided into four, the detector-detecting electrodes 1222, 1322, 1422, 1522 corresponded to the four divided regions. The detector-detecting electrodes 1222, 1322, 1422, 1522 are disposed in parallel to a bottom face of the semiconductor silicon wafer 1060.

With this structure, it is possible to detect, from output voltages respectively corresponding to the sensor electrodes 1020, 1030, 1040 and 1050, not only whether or not there exists the semiconductor silicon wafer 1060, but also whether the semiconductor silicon wafer 1060 is disposed on a right position on the arm 1010, and whether or not the semiconductor silicon wafer 1060 is deviated to an abnormal position. Further, it is also possible to detect warpage and bend of the semiconductor silicon wafer 1060 from a balance of the plurality of output voltages. An abnormality of the semiconductor silicon wafer 1060 such as the warpage can also be detected simultaneously with the transfer operation of the wafer, which reduces the costs.

Figure 5:
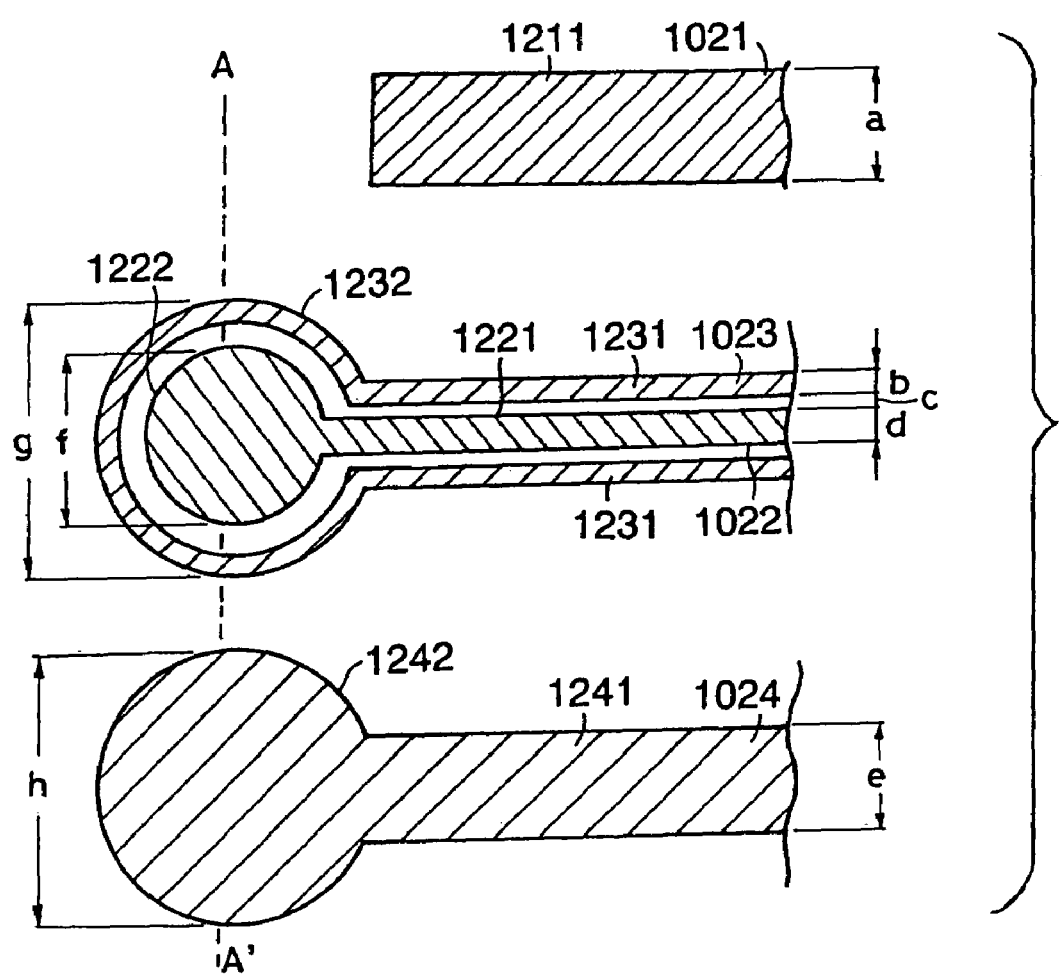
FIG. 5 is an enlargement of FIG. 3, and a schematic partial transversal sectional view for explaining a transfer arm having the semiconductor wafer-detecting function according to the second embodiment of the present invention.

Referring to FIG. 5, one concrete example of the transfer arm 1010 having the wafer-detecting function of the present embodiment will be explained while taking the case of the sensor electrode 1020. A width "a" of the electrode introducer-shield electrode 1211 was set to 5 mm, a width "b" of the shield electrode 1023 was set to 1 mm, a width "d" of the electrode introducer-detecting electrode 1221 was set to 2 mm, a distance "c" between the electrode introducer-shield electrode 1231 and the electrode introducer-detecting electrode 1221 was set to 0.5 mm, a diameter "f" of the detector-detecting electrode 1222 was set to 10 mm, an outer diameter "g" of the detector-shield electrode 1232 was set to 14 mm, a width "e" of the electrode introducer-shield electrode 1241 was set to 5 mm, and a diameter "h" of the detector-shield electrode 1242 was set to 14 mm. Sizes of corresponding parts of the sensor electrodes 1030, 1040 and 1050 are the same as those of the sensor electrode 1020. A thickness of each of the insulator layers 1012 to 1016 is 0.5 mm.

Output voltages of C/V conversion devices 1101 to 1104 when the semiconductor silicon wafer 1060 is normally mounted on the transfer arm 1010 having the wafer-detecting function as shown in FIG. 6A are substantially the same, but when the position of the semiconductor silicon wafer 1060 is deviated as shown in FIG. 6B, if the semiconductor silicon wafer 1060 is not located over the circular detector-detecting electrode 1222, the output voltage is substantially the same as that when no semiconductor silicon wafer 1060 is mounted over the transfer arm 1010 having the wafer-detecting function. When the semiconductor silicon wafer 1060 exists only over a portion of a circular detector-detecting electrode 1522, the output voltages become intermediate output voltages of the above two values.

As described above, since the C/V conversion devices 1101 to 1104 used in the present embodiment are sensor circuits which can detect the electrostatic capacitance with high precision, the sensors may not be very sensitive, and the electrode structure can be simplified. Thus, the transfer arm 1010 having the wafer-detecting function may be provided with the detecting electrodes 1022, 1032, 1042 and 1052 only, and even if only one of the shield electrodes 1021 (1031, 1041), 1023 (1033, 1043) and 1024 (1034, 1044) is provided, the performance of the arm is enhanced. Therefore, the arm can be formed by providing a detecting electrode and a shield electrode on one face of only one ceramics substrate to form the arm, and the arm can be formed also by baking electrodes on both faces of one ceramics substrate.

In the present embodiment, the four C/V conversion devices are used, the sensor electrode 1020 is connected to the C/V conversion device 1101, the sensor electrode 1030 is connected to the C/V conversion device 1102, the sensor electrode 1040 is connected to the C/V conversion device 1103, and the sensor electrode 1050 is connected to the C/V conversion device 1104. Instead of this structure, one C/V conversion device may be used, and the connection to the sensor electrodes 1020, 1030, 1040 and 1050 may be switched using a multiplexor. In such a case, all the shield lines for the sensor electrodes 1020, 1030, 1040 and 1050 may be connected to a shield of the C/V conversion device, or may be switched using the multiplexor.

The transfer arm 1010 having the wafer-detecting function of the present embodiment can be used for a wafer transfer apparatus and a semiconductor manufacturing apparatus.

3rd Embodiment

Figure 7:
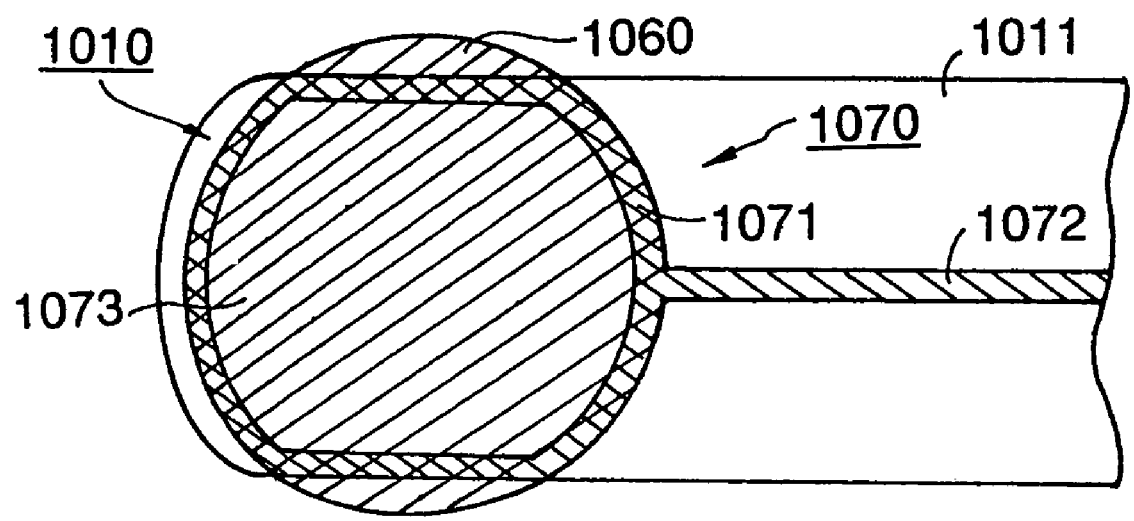
FIG. 7 is a schematic partial plan view for explaining a transfer arm having a semiconductor wafer-detecting function according to a third embodiment of the invention.

FIG. 7 is a schematic partial plan view for explaining a transfer arm having a semiconductor wafer-detecting function of the third embodiment. FIGS. 8A, 8B, 8C 8D and 8E are schematic partial plan views for explaining modifications of the transfer arm having the semiconductor wafer-detecting function of the third embodiment.

In the third embodiment, an insulator 1011 made of alumina-based ceramics is integrally provided thereon with a detecting electrode 1070. The detecting electrode 1070 comprises a detector-detecting electrode 1071 for detecting a to-be detected object, and an electrode introducer-detecting electrode 1072 for introducing an electrode to the detector-detecting electrode 1071. The detector-detecting electrode 1071 includes an opening 1073 therein, and an outer periphery of an arc portion of the detector-detecting electrode 1071 is the same as an outer periphery of a semiconductor silicon wafer 1060. An area of the electrode of the detector-detecting electrode 1071 is equal to or less than one-tenth of an area of a bottom face of the semiconductor silicon wafer 1060. The electrode introducer-detecting electrode 1072 is connected to an inverse input terminal of an operational amplifier of a Z/V conversion device (used as the C/V conversion device in the present embodiment) which will be explained later.

If the semiconductor silicon wafer 1060 is deviated from its normal mounting position, since a portion of the detector-detecting electrode 1071 is exposed from the semiconductor silicon wafer 1060 and a capacitance is varied, it is possible to detect a deviation of the position of the semiconductor silicon wafer 1060. In the present embodiment, since the area of the electrode of the detector-detecting electrode 1071 which detects the to-be detected object is sufficiently smaller than (equal to or smaller than one-tenth) the area of the bottom face of the semiconductor silicon wafer 1060 which is the object to be detected, the deviation of the position can be detected with high precision.

Figure 8A:
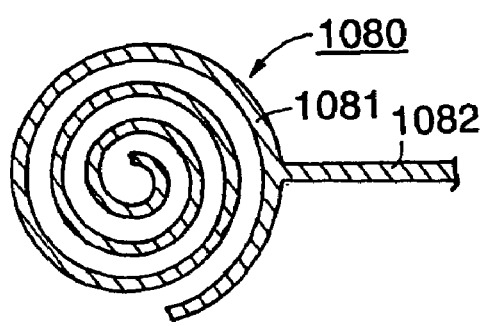
FIGS. 8A, 8B, 8C, 8D and 8E are schematic partial plan views for explaining modifications of the transfer arm having the semiconductor wafer-detecting function according to the third embodiment of the invention.
Figure 8B:
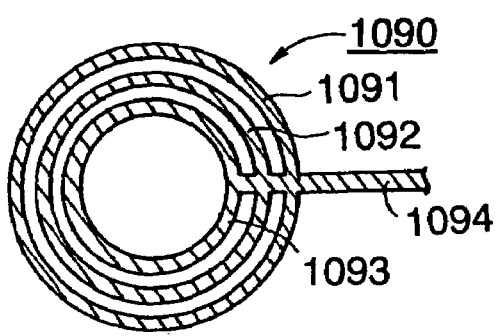

The detector-detecting electrode may be a spiral detector-detecting electrode 1081 as shown in FIG. 8A, or may be multiple-ring-like detector-detecting electrodes 1091 to 1093 as shown in FIG. 8B. The detector-detecting electrode 1081 and the detector-detecting electrodes 1091 to 1093 are connected to the inverse input terminal of the operational amplifier of the Z/V conversion device (used as the C/V conversion device in the present embodiment) which will be explained later respectively through an electrode introducer-detecting electrode 1082 and an electrode introducer-detecting electrode 1094.

Figure 8C:
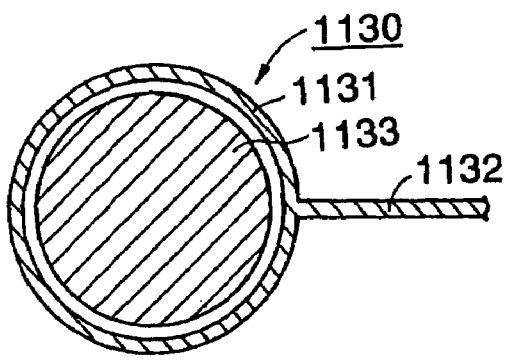
Figure 8D:
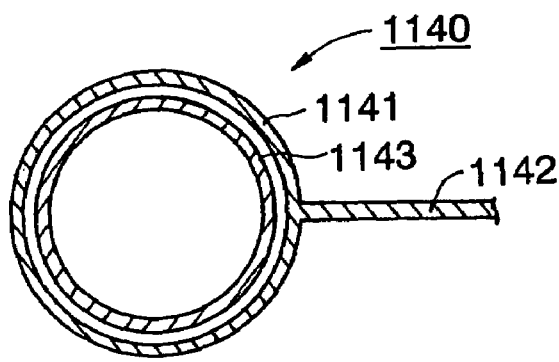

Further, the shield electrode may come inside the detector-detecting electrode and may be connected thereto through a through hole or the like. For example, a disc-like shield electrode 1133 may be provided in a ring-like detector-detecting electrode 1131 as shown in FIG. 8C, or a ring-like shield electrode 1143 may be provided in a ring-like detector-detecting electrode 1141 as shown in FIG. 8D. These shield electrodes 1133 and 1143 are connected to the non-inverse input terminal of the operational amplifier of the ZN conversion device (which is used as the C/V conversion device in the present embodiment) which will be explained latter through the through hole or the like provided in the insulator 1011. The detector-detecting electrodes 1131 and the 1141 are connected to the inverse input terminal of the operational amplifier of the ZN conversion device (which is used as the C/V conversion device in the present embodiment) which will be explained latter respectively through the electrode introducer-detecting electrode 1132 and the electrode introducer-detecting electrode 1142.

Figure 8E:
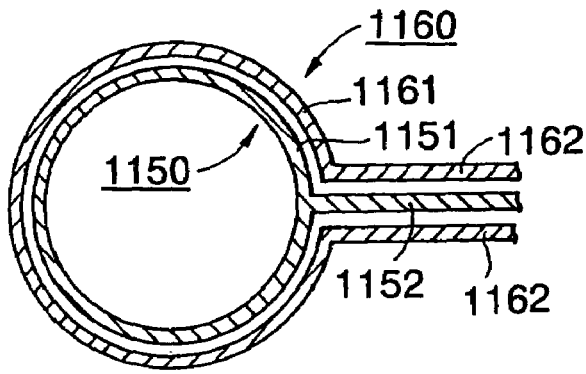

Further, a detector-shield electrode 1161 may be disposed outside of a ring-like detector-detecting electrode 1151 as shown in FIG. 8E. The detector-detecting electrode 1151 is connected to the inverse input terminal of the operational amplifier of the Z/V conversion device (which is used as the C/V conversion device in the present embodiment) which will be explained latter through an electrode introducer-detecting electrode 1152. The detector-shield electrode 1161 is connected to the non-inverse input terminal of the operational amplifier of the Z/V conversion device (which is used as the C/V conversion device in the present embodiment) which will be explained latter through electrode introducer-shield electrodes 1162 disposed on both sides of the electrode introducer-detecting electrode 1152.

Further, shield electrodes shielding the electrode introducer-detecting electrodes 1072, 1082, 1094, 1132, 1142 and 1152, exposing the detector-detecting electrodes 1071, 1081, 1091 to 1093, 1131 and 1141 and being connected to the non-inverse input terminal of the operational amplifier of the Z/V conversion device (which is used as the C/V conversion device in the present embodiment) which will be explained latter, may be provided on upper layers or lower layers of the detector-detecting electrodes 1071, 1081, 1091 to 1093, 1131 and 1141. Further, shield electrodes shielding both the electrode introducer-detecting electrodes 1072, 1082, 1094, 1132, 1142 and 1152 and the detector-detecting electrodes 1071, 1081, 1091 to 1093, 1131 and 1141 and being connected to the non-inverse input terminal of the operational amplifier of the Z/V conversion device (which is used as the C/V conversion device in the present embodiment) which will be explained latter, may be provided on upper layers or lower layers of the detector-detecting electrodes 1071, 1081, 1091 to 1093, 1131 and 1141. These two kinds of shield electrodes may respectively be provided on the upper and lower layers of the detector-detecting electrodes 1071, 1081, 1091 to 1093, 1131 and 1141.

In the present embodiment, it is preferable that an electrode area of each of the detector-detecting electrodes 1071, 1081, 1091 to 1093, 1131 and 1141 is equal to or less than one-tenth of an area of a bottom face of the semiconductor silicon wafer 1060. It is also preferable that when the semiconductor silicon wafer 1060 is normally mounted, all the detector-detecting electrodes 1071, 1081, 1091 to 1093, 1131 and 1141 are covered with the semiconductor silicon wafer 1060, or a sufficiently large area (equal to or greater than nine-tenths of the entire area) of the detector-detecting electrodes 1071, 1081, 1091 to 1093, 1131 and 1141 is covered with the semiconductor silicon wafer 1060. It is preferable that outermost peripheries of the detector-detecting electrodes 1071, 1081, 1091 to 1093, 1131 and 1141 are equal to or smaller than an outer periphery of the semiconductor silicon wafer 1060.

It is preferable that when a bottom face of the semiconductor silicon wafer 1060 is divided into a plurality of sub-regions such that areas of the sub-regions are equal to each other, the detector-detecting electrodes 1071, 1081, 1091 to 1093, 1131 and 1141 are disposed to be opposed to all of the plurality of sub-regions.

The manufacturing method of the present embodiment is the same as that of the second embodiment.

As a material for the insulator 11 of the first embodiment, and the insulator 1011 of the second and third embodiments, a heatproof material used in semiconductor manufacturing process such as resin and ceramic is preferably used.

Further, it is preferable that each of electrodes in the first to third embodiments is covered with an insulator layer such as resin and ceramic. This is because that the electrodes are prevented from being deteriorated under high temperature conditions.

Next, referring to FIGS. 9 to 14, a structure of the Z/V conversion device (which is used as the C/V conversion device in the first to third embodiments) used in the first to third embodiments will be explained in detail.

FIG. 9 is a circuit diagram schematically showing a first example of the Z/V conversion device according to the first to third embodiments. In FIG. 9, an operational amplifier 1 has extremely great impedance and gain. A feedback impedance element 3 is connected between an output terminal 2 and an inverse input terminal (−) of the operational amplifier 1 to form a negative feedback loop to the operational amplifier 1. An alternating-current(AC) signal generator 4 for generating an alternating voltage is connected to a non-inverse input terminal (+) of the operational amplifier 1, and one end of a signal line 5 is connected to the inverse input terminal (−) of the operational amplifier 1. A detecting electrode 61 (the detecting electrode 32 in the first embodiment, the detecting electrodes 1022, 1032, 1042 and 1052 in the second embodiment, and the detecting electrode 1070 and the detector-detecting electrodes 1081, 1091 to 1093, 1131, 1141 and 1151 in the third embodiment) for detecting on impedance component of unknown value, i.e., an impedance component to be detected (an object) 6, is connected to the other end of the signal line 5. The other electrode 62 of the object 6 is grounded, fixed to a constant DC bias potential, or brought into a floating state.

An AC bias can be applied to the other electrode 62, but in such a case, mathematical analysis of the output voltage of the operational amplifier 1 becomes complicated.

The signal line 5 is surrounded by a shield 7 so that unnecessary signal from outside such as a noise is prevented from being induced to the signal line 5. The shield 7 comprises one shield layer, and is not grounded but connected to the non-inverse input terminal (+) of the operational amplifier 1. The shield electrodes 21, 31, and 41 are connected to the shield 7 in the first embodiment, the shield electrodes 1021, 1023, 1024, the shield electrodes 1031, 1033, 1034, the shield electrodes 1041, 1043, 1044 and the shield electrodes 1051, 1053, 1054 are connected to the shields 7 of the CN conversion devices 1101 to 1104 respectively in the second embodiment, and the shield electrodes 1133, 1143 or 1160 is connected to the shield 7 in the third embodiment.

A negative feedback is applied to the operational amplifier 1 through the feedback impedance element 3, and the operational amplifier 1 has the extremely great impedance and gain. Therefore, the inverse input terminal (−) and the non-inverse input terminal (+) of the operational amplifier 1 are in the imaginary short state, and the potential difference therebetween is substantially zero. Thus, since the signal line 5 and the shield 7 are at the same potential, a stray electrostatic capacitance generated between the signal line 5 and the shield 7 can be canceled. This fact is established irrespective of a length of the signal line 5. Therefore, even if the stray electrostatic capacitance generated between the signal line 5 and the shield 7 by moving, bending or folding the signal wire 5 is varied, the output voltage is not varied.

An AC output voltage of the AC signal generator 4 is represented by Vi, an impedance component to be detected, i.e., impedance value of the object 6 to be detected is represented by Zx, a current flowing through the object 6 is represented by $i_1$, a known impedance value of the feedback impedance element 3 is represented by Zf, a current flowing through the feedback impedance element 3 is represented by $i_2$, a voltage of the inverse input terminal (−) of the operational amplifier 1 is represented by Vm, and an output voltage of the operational amplifier 1 is represented by Vo. Since the two input terminals of the operational amplifier 1 are in the imaginary short state as described above, the voltage Vm of the inverse input terminal (−) is at the same potential as the AC signal output voltage Vi of the AC signal generator 4. That is, Vi=Vm.

Further, the following equations are established:

$$i_1 = -Vm/Zx = -Vi/Zx$$

$$i_2 = (Vm-Vo)/Zf = (Vi-Vo)/Zf.$$

Here, since $i_1$ is equal to $i_2$, the output voltage Vo of the operational amplifier 1 is obtained by the following equation (1):

$$Vo = Vi(1+Zf/Zx) \qquad (1).$$

The equation (1) shows that the operational amplifier 1 outputs an AC voltage which is varied depending upon the impedance value Zx.

From the above facts, it can be found that the a portion (a block 8 surrounded by a chain line in FIG. 9) including the signal line 5, the shield 7, the AC signal generator 4, the operational amplifier 1 and the feedback impedance element 3 constitute the Z/V conversion device which converts the impedance Zx of the object 6 connected to the other end of the signal line 5 into the corresponding voltage Vo.

It should be noted that since the inverse and non-inverse input terminals of the operational amplifier 1 are in the imaginary short state, the stray electrostatic capacitance generated between the signal line 5 and the shield 7 does not appear between the two input terminals of the operational amplifier 1. For this reason, the output voltage Vo of the operational amplifier 1 does not include at all a term relating to the stray electrostatic capacitance generated between the signal line 5 and the shield 7, and therefore, even if the impedance Zx of the object 6 is very large, a voltage Vo only corresponding to this very large impedance Zx is output from the operational amplifier 1.

The output voltage of the operational amplifier 1 is represented by the above equation (1), and the impedance Zf of the feedback impedance element 3 and the frequency and amplitude of the AC signal Vi are known in the equation (1). A frequency of the AC output voltage Vo of the operational amplifier 1 is the same as that of the AC signal Vi, and the amplitude can be obtained by detecting a peak value of the output of the operational amplifier 1. Therefore, the impedance value Zx can be obtained by calculating the equation (1) backward. For example, if the impedance Zx of the object 6 is the capacitance component Cx, the relation between Cx and the amplitudes of Vo were as shown in a graph shown in FIG. 10. It is also possible to obtain the impedance value Zx by retrieving a function table in which the relation between Zx and Vo was previously stored.

Further, the AC output voltage Vo is supplied to an appropriate circuit to generate a DC voltage Vdd corresponding to the AC output voltage, and the impedance value Zx can be obtained based on the DC voltage Vdd obtained by the circuit. As the circuit for generating the DC voltage Vdd, an arbitrary AC-DC conversion circuit such as a rectifier smoothing circuit can be employed. If necessary, the AC-DC conversion may be carried out after the output voltage Vo was amplified.

By combining the block 8 surrounded by the chain line in FIG. 9 and the processing circuit for obtaining the impedance Zx from the output voltage Vo of the operational amplifier 1 or the DC voltage Vdd corresponding to the output voltage Vo, the impedance value Zx of the object 6 can be detected.

In the first example shown in FIG. 9, the shield 7 can be a pipe-like shield. Alternatively, the shield 7 can be formed into a single-layer mesh structure by weaving thin metal strips so as to provide a coaxial cable with flexibility comprising the signal line 5 and the shield 7.

However, when the shield 7 is formed into the single-layer mesh structure, if the frequency of the AC signal generator 4 is increased to high frequency, there is an adverse possibility that high frequency signals are leaked from the signal line 5 through fine holes of the shield 7, and this affects the AC output voltage Vo. Further, disturbance noise of high frequency may not be cut off by the shield 7 and may be transmitted to the signal line 5, and in this case also, this affects the AC output voltage Vo. When a person touches such a coaxial cable with his or her hand, the output voltage Vo from the operational amplifier 1 may be varied.

Figure 11:
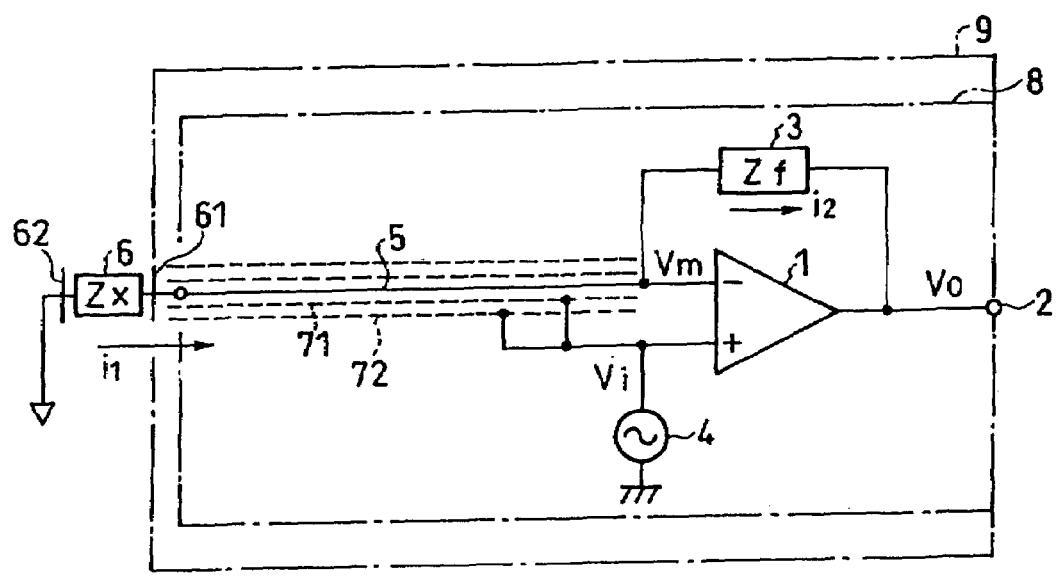
FIG. 11 is a circuit diagram showing a second example of the Z/V conversion device according to the first to third embodiments of the present invention.

FIG. 11 shows a second example of the ZN conversion device according to the first to third embodiments in which the ZN conversion can be carried out even when the shield is formed into the mesh structure and provided with flexibility. In FIG. 11, the same elements as those of the first example shown in FIG. 9 are designated by the same reference numerals. The second example is different from the first example in that the shield is formed into a double-layer mesh structure comprising an inner shield (first shield layer) 71 and an outer shield (second shield layer) 72 both connected to the non-inverse input terminal of the operational amplifier 1.

In the second example, since the shield is formed into the double-layer mesh structure, the diameter of the hole of the shield is small as compared with that of the shield of the single-layer mesh structure. Therefore, even if the frequency of the AC signal generator 4 is high, the leaking amount of signals from the signal line 5 to the shields 71 and 72 is reduced, the influence of the noise from outside is also reduced and thus, it is possible to obtain the output voltage Vo which precisely corresponds to the impedance Zx to be detected. For example, in the first and second embodiments, when the shield is formed into the single-layer mesh structure and a electrostatic capacitance is detected at a frequency of about 1 MHz, if a person touches the coaxial cable with his or her hand a variation in output of about hundreds ppm is generated, but if the shield is formed into the double-layer mesh structure, almost no variation is generated even if the hand touches the coaxial cable.

Figure 12A:
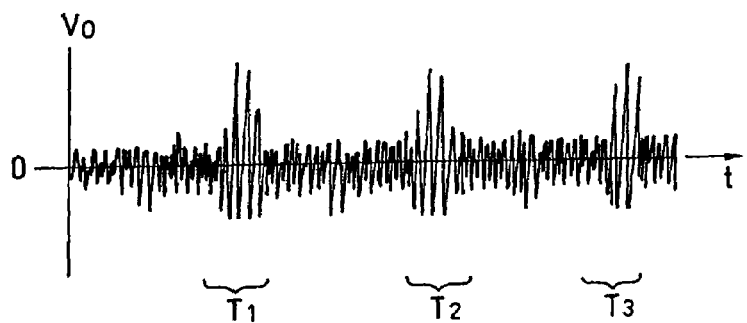
FIGS. 12A and 12B are graphs showing test results obtained when influences caused by noises are verified by an actual machine test using the circuit of the first example and the circuit of the second example.
Figure 12B:
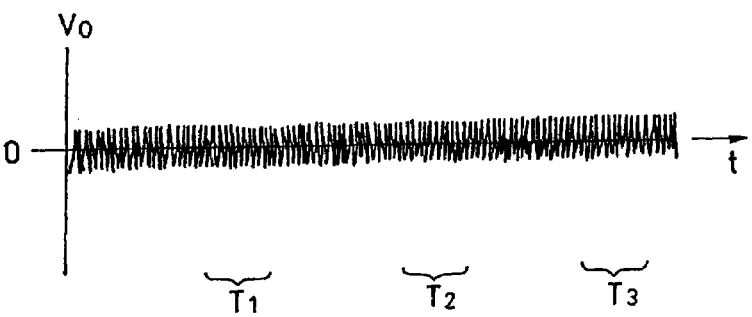

FIGS. 12A and 12B show results of an experiment when the first and second example were used as a moisture meter and influence of noise caused by the shield of single structure and the shield of the double structure were verified. In this experiment, an AC signal Vi of 1 MHz was generated by the AC signal generator 4, an influence appearing in the output voltage Vo caused by intermittently touching the coaxial cable with a hand was detected.

As apparent from FIGS. 12A and 12B, in the case of the first example employing the single-layer mesh structure, great noises were superposed in the output voltage Vo at periods $T_1$, $T_2$ and $T_3$ during which the hand touched coaxial cable, but noises were not superposed in the output voltage in the second example employing the double-layer mesh structure. Therefore, it was verified that when the shield was formed into the double-layer mesh structure, the influence of noise was able to be reduced to almost zero.

Figure 13:
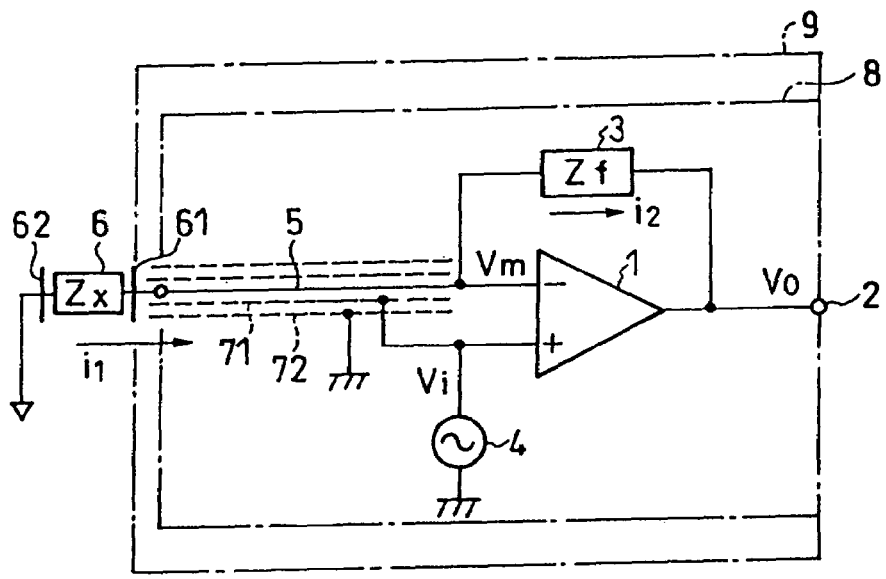
FIG. 13 is a circuit diagram showing a third example of the Z/V conversion device according to the first to third embodiments of the present invention.

FIG. 13 shows a third example of the Z/v conversion device according to the first to third embodiments. The third example is different from the second example in that although the shield is formed into the double-layer structure and the inner shield 71 is connected to the non-inverse input terminal of the operational amplifier 1 as in the second example, the outer shield 72 is grounded.

If the outer shield 72 is grounded as in the third example, interlayer capacitance, i.e., parasitic capacitance of 1000 pF/m or greater is generated between the inner shield 71 and the outer shield 72, and if the length of the coaxial cable (the signal line 5 and the inner and outer shields 71 and 72) is increased, the parasitic capacitance is increased. Further, if the frequency of the AC signal generator 4 is increased, impedance of the parasitic capacitance is reduced, and the leakage of signal is increased. Therefore, it is preferable that the third example is employed when the detecting electrode 61 and the operational amplifier 1 are disposed relatively closely to each other and the coaxial cable is relatively short, and when the frequency of the AC signal generator 4 is relatively low.

In the first to third example according to the first to third embodiments, it is preferable that the signal line 5 is entirely shielded by the shield 7, or the inner and outer shields 71 and 72. However, only a portion (10% or more) of the signal line 5 may be shielded depending upon a usage state. It is more effective to shield not only the signal line 5 but also all the devices except the detecting electrode 61.

In the first to third embodiments, the impedance component of the object 6 to be detected can be any kind of impedance component such as a resistance, a capacitor and a coil.

When an electrostatic capacitance element Cx is used as the impedance component to be detected, the conversion device of the first to third examples is a electrostatic capacitance-voltage conversion device, and a electrostatic capacitance sensor is constituted. In this case, the electrode 62 (or an electrode corresponding thereto) which is not connected to the signal line 5 of the electrostatic capacitance element Cx is grounded, or set to an appropriate bias potential, or released into space.

It is preferable that a capacitor is employed as the feedback impedance element 3 when the impedance component to be detected of the object of measurement is an electrostatic capacitance component, a resistance or the capacitor is employed as the feedback impedance element 3 when the impedance component of the object is a resistance component, and one of a coil, a resistance and a capacitor that has most excellent S/N ratio is employed as the feedback impedance element 3 when the impedance component of the object is an inductive component. When the feedback impedance element 3 and the impedance component of the object have the same characteristics, noise is further reduced in many cases.

A combination of different characteristics may be employed of course. For example, as shown in FIG. 12, when the object 6 is the electrostatic capacitance component Cx, a resistance may be employed as the feedback impedance element 3. Since the resistance is used as the feedback impedance element is used, it is easy to form the operational amplifier and the feedback resistance as one chip. In this case, when angular frequency of an output of the AC signal generator 4 is represented by ω and a resistance value of the feedback impedance element 3 is represented by Rf, the output voltage Vo can be expressed from the equation (1) as follows:

$$Vo = Vi(1 + j\omega Rf \times Cx) \quad (2).$$

A parallel circuit of a resistance and a capacitor and the like may be employed as the feedback impedance element 3. The feedback impedance element 3 is not limited to this only, and an arbitrary combination is also possible.

As apparent from the equation (1), connected position of the feedback impedance element 3 and the object 6 may be exchanged. That is, the object to be detected may be connected between the inverse input terminal and the output terminal of the operational amplifier 1, and the impedance element or circuit of known value may be connected to one end of the signal line 5. In this case, it is necessary to shield the two lines respectively connecting between the two detecting electrodes of the impedance component to be detected and the inverse input terminal and the output terminal of the operational amplifier 1.

Further, the feedback impedance element 3 may also be an unknown impedance value. In this case, since both Zf and Zx in the right side of the equation (1) are unknown values, the output voltage Vo becomes a voltage value corresponding to a ratio of Zf to Zx (=Zf/Zx).

Figure 14:
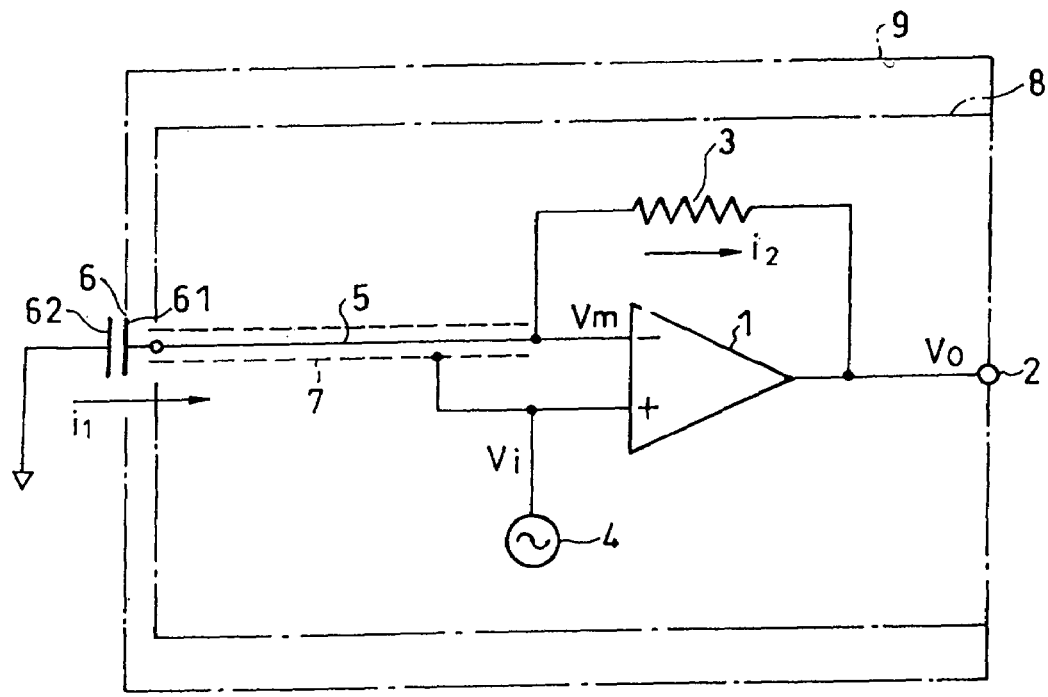
FIG. 14 is a circuit diagram when an electrostatic capacitance is employed as an impedance component to be detected, and a resistance is employed as a feedback impedance circuit in the circuit of the first example.
Figure 15:
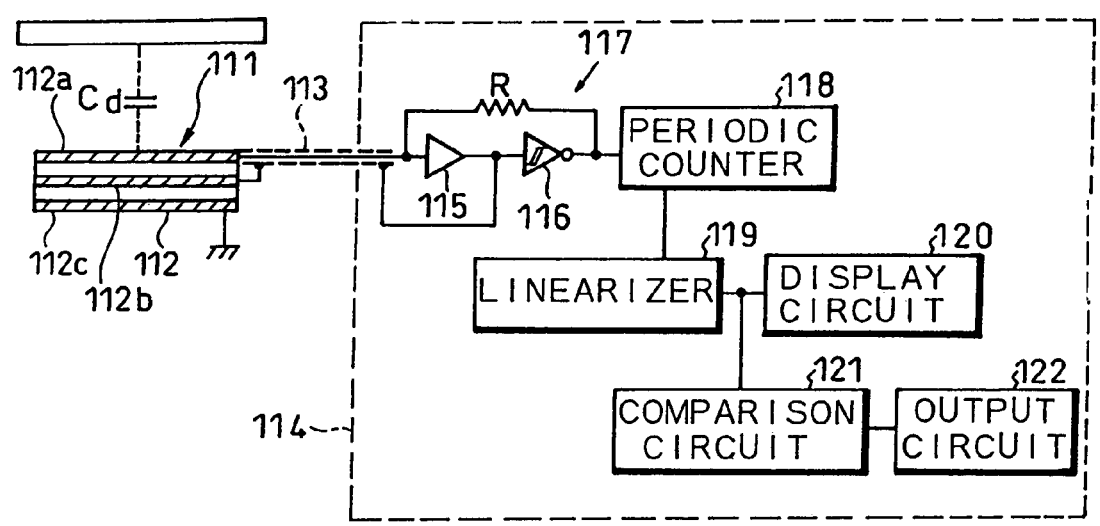
FIG. 15 is a diagram showing a conventional electrostatic capacitance nearby-object detecting sensor.

On the other hand, in the Z/V conversion device shown in FIG. 14, when the feedback impedance element 3 is also an unknown resistance component and both the resistance component and the electrostatic capacitance component of the object 6 are linearly varied with respect to a variation Y (e.g., a pressure, a temperature or the like), a value Zf/Zx=jωCxRf of a ratio of these impedances is varied in accordance with the variation Y, and an output voltage Vo(=Vi(1+Zf/Zx)=Vi(+jωCxRf)) which is varied in correspondence with the variation Y is obtained.

Here, even if the two unknown impedance components are not linearly varied with respect to a certain variate Y, it is possible to linearly vary the output voltage Vo with respect to the variate Y, and on the contrary, even if each of the two impedance components are linearly varied with respect to the variate Y, it is possible to non-linearly vary the output voltage Vo.

Since the Z/V conversion device used in the first to third embodiments is structured as described above, the following effects can be obtained.

(1) Since the signal wire connected to the impedance component to be detected of the object and the shield for surrounding the signal line are at the same potential by the imaginary short of the two input terminals of the operational amplifier, a voltage relying only on the value of the impedance component to be detected without being influenced by the parasitic capacitance formed between the signal line and the shield. Therefore, even if the impedance value is very large, the Z/V conversion can be carried out with high precision.

(2) Even if one of electrodes of the impedance component to be detected is biased to a certain potential, a voltage corresponding to that impedance value can be obtained.

(3) By forming the shield into the double mesh structure, not only the coaxial cable comprising the signal line and the shield can be provided with the flexibility, but also the leakage of signal from the signal line and the diffraction of noise from outside can be reduced and therefore, the Z/V conversion can be carried out with higher precision.

(4) When the impedance component to be detected is used as the feedback impedance circuit, an output voltage corresponding to an impedance ratio of the two impedance components to be detected can be obtained with high precision without being influenced by the parasitic capacitance of the signal line.

(5) Even if the length of the signal line is increased, since the signal line is not influenced by the parasitic capacitance formed between the signal line and the shield, it is possible to measure very large impedance with high precision.

Since the Z/v conversion device having excellent characteristics as described above is used for the transfer arms 10, 1010 having the wafer-detecting functions, even if the structure of the transfer arm having the wafer-detecting function is simple, the semiconductor wafer can be detected with high precision in the first embodiment, deviation, warpage and bending of the semiconductor wafer can be detected with high precision in the second embodiment, and deviation of the semiconductor wafer can be detected with high precision in the third embodiment.

Although the transfer arm having the wafer-detecting function for a semiconductor wafer is explained as the first to third embodiments, the present invention can preferably be applied to a transfer arm for manufacturing a liquid crystal display element for a glass substrate for forming the liquid crystal display element, or other transfer arms having a subject-detecting function, a wafer transfer apparatus having the transfer arm having the subject-detecting function, a semiconductor manufacturing apparatus having the transfer arm having the subject-detecting function, a substrate transfer apparatus for manufacturing a liquid crystal display element having a transfer arm provided with a substrate-detecting function for a glass substrate and the like for forming the liquid crystal display element, and a liquid crystal display element manufacturing apparatus having a transfer arm provided with substrate-detecting function for manufacturing the liquid crystal display element.

Although various exemplary embodiments and examples have been shown and described, the invention is not limited to the embodiments and examples shown. Therefore, the scope of the invention is intended to be limited solely by the scope of the claims that follow.

What is claimed is:

1. An object mounting body for mounting an object to be mounted, comprising a detecting electrode and a shield electrode, wherein
said detecting electrode comprises a detecting portion for detecting an object to be detected and an introducing portion for introducing an electrode to said introducing portion
said detecting electrode and said shield electrode are flat plate shaped electrodes and laminated such that they become layers different from each other, and
said detecting electrode and said shield electrode are provided such that said detecting portion and said shield electrode are not superposed, and at least a portion of said detecting portion and said shield electrode are superposed as viewed from the laminated direction of said detecting electrode and said shield electrode.

2. An electrostatic capacitance sensor componet, comprising an electrostatic capacitance detector having a detecting electrode and a first shield electrode, and a flat plate-shaped second shield electrode laminated with said detecting electrode such that said second shield electrode and said detecting electrode become layers different from each other, wherein
said detecting electrode comprises a detecting portion for detecting an object to be detected and an introducing portion for introducing an electrode to said detecting portion,
said detecting portion is a flat plate-shaped electrode, said detecting electrode and said first shield electrode are provided such that at least a portion of said first shield electrode is located on a side of said detecting portion as viewed from a direction perpendicular to a main face of said flat plate-shaped electrode, and
said detecting electrode and said second shield electrode are provided such that said detecting portion and said second shield electrode are not superposed, and at least a portion of said introducing portion and said second shield electrode are superposed as viewed from the laminated direction.

3. An electrostatic capacitance sensor component as recited in claim 2, wherein
said electrostatic capacitance detector further comprises a third shield electrode,
said third shield electrode is a flat plate-shaped electrode and laminated with said detecting electrode on the opposite side from said second shield electrode with respect to said detecting electrode, and
said detecting electrode and said third shield electrode are provided such that said detecting portion and said introducing portion are superposed above said third shield electrode as viewed from the laminated direction of said detecting electrode and said shield electrode.

4. An electrosatic capacitance sensor component as recited in claim 3, wherein said detecting electrode is entirely shielded by said first electrode, said second electrode and said third electrode except in one direction of said detecting portion of said detecting electrode.

5. An electrostatic capacitance sensor component comprising an electrostatic capacitance detector having a detecting electrode and a first shield electrode, and a flat plate-shaped second shield electrode laminated with said detecting electrode such that said second shield electrode and said detecting electrode become layers different from each other, wherein
said detecting electrode comprises a detection portion for detecting an object to be detected and an introducing portion for introducing an electrode to said detecting portion,
said detecting portion is a flat plate-like electrode, said detecting electrode and said first shield electrode are provided such that at least a portion of said first shield electrode is located on a side of said detecting portion as viewed from a direction perpendicular to a main face of said flat plate-like electrode, and
said detecting electrode and said second shield electrode are provided such that said detecting portion and said introducing portion are superposed above said second shield electrode as viewed from the laminated direction of said detecting electrode and said shield electrode.

6. An object mounting apparatus, comprising
an object mounting body for mounting an object,
at least two object detecting electrodes mounted to said object mounting body,
at least two shield electrodes mounted to said object mounting body, and
at least two detecting circuits respectively connected to said at least two object detecting electrodes,
wherein
each of said two detecting circuits comprises
an operational amplifier in which a feedback impedance circuit is connected between an output terminal and an inverse input terminal of said operational amplifier,
a signal line connected between said inverse input terminal of said operational amplifier and one of said at least two object detecting electrodes,
an alternating-current signal generator connected to a non-inverse input terminal of said operational amplifier, and,
a shield for shielding at least a portion of said signal line, said shield being connected to said non-inverse input terminal of said operational amplifier and said alternating-current signal generator and the at least two shield electrodes, and wherein each of said at least two object detecting electrodes comprises a detecting portion for detecting the object to be detected and an introducing portion for introducing an electrode to said detecting portion, each of said at least two shield electrodes shields at least a portion of each said introducing portions.

7. An object mounting apparatus as recited in claim 6, wherein
said object is a flat plate-like object, and
said detecting portions of said at least two object detecting electrodes are disposed such that when said object is mounted on said object mounting body, an arrangement of said detecting portions is in parallel to a bottom face of said object.

8. An object mounting apparatus as recited in claim 6, wherein said object is a flat plate-like object, and
when said object is mounted on said object mounting body, if a surface of projection obtained by projecting said object on said object mounting body is divided into at least two sub-regions such that areas of the sub-regions are equal to each other, said at least two object detecting electrodes are disposed on positions respectively corresponding to said at least two sub-regions.

9. A wafer transfer apparatus wherein said wafer transfer appratus comprises an object mounting apparatus as recited in claim 6, wherein said object is a semiconductor wafer.

10. A substrate transfer apparatus for manufacturing a liquid crystal display device, wherein said substrate transfer apparatus comprises an object mounting apparatus as recited in claim 6, and said object is a substrate for manufacturing a liquid crystal display device.

11. A semiconductor device manufacturing apparatus comprising an object mounting apparatus as recited in claim 6, wherein said object is a semiconductor wafer.

12. A liquid crystal display device manufacturing apparatus comprising an object mounting apparatus as recited in claim 6, wherein said object is a substrate for manufacturing a liquid crystal display device.

13. An object mounting apparatus, comprising
an object mounting body for mounting an object,
at least two object detecting electrodes mounted to said object mounting body,
an operational amplifier in which a feedback impedance circuit is connected between an output terminal and an inverse input terminal of said operational amplifier,
a signal line connected to said inverse input terminal of said operational amplifier,
an alternating-current signal generator connected to a non-inverse input terminal of said operational amplifier,
a shield for shielding at least a portion of said signal line, said shield being connected to said non-inverse input terminal of said operational amplifier and said alternating-current signal generator, and
a switch for switching connections between said signal line and said at least two object detecting electrodes and capable of connecting said signal line to any one of said at least twp object detecting electrodes.

14. An object mounting appratus as recited in claim 13, further comprising at least two shields electrodes mounted to said object mounting body, wherein said at least two shield electrodes respectively shield at least portions of said at least two object detecting electrodes and said at least two shield electrodes are respectively connected to said shields or connected to said shields through said switch.

15. A wafer transfer apparatus wherein said wafer transfer apparatus comprises an object mounting apparatus as recited in claim 13, wherein said object is a semiconductor wafer.

16. A substrate transfer apparatus for manufacturing a liquid crystal display device, wherein said substrate transfer apparatus comprises an object mounting apparatus as recited in claim 13, and said object is a substrate for manufacturing a liquid crystal display device.

17. A semiconductor device manufacturing apparatus comprising an object mounting apparatus as recited in claim 13, wherein said object is a semiconductor wafer.

18. A liquid crystal display device manufacturing apparatus comprising an object mounting apparatus as recited in claim 13, wherein said object is a substrate for manufacturing a liquid crystal display device.

\* \* \* \* \*